United States Patent [19]

Peterson et al.

[11] Patent Number: 5,279,697

[45] Date of Patent: Jan. 18, 1994

[54] DEVICE FOR FORMING FLEXOGRAPHIC PRINTING PLATE

[75] Inventors: John A. Peterson; Kurt F. F. Feil; Craig D. Lien; John A. Martens; Gary A. Staus; Gary D. VanDerWerff, all of St. Paul, Minn.

[73] Assignee: Minnesota Mining and Manufacturing Company, St. Paul, Minn.

[21] Appl. No.: 908,492

[22] Filed: Jun. 30, 1992

Related U.S. Application Data

[63] Continuation of Ser. No. 560,619, Jul. 31, 1990, abandoned.

[51] Int. Cl.⁵ .............................................. B32B 31/00
[52] U.S. Cl. ........................... 156/358; 156/555; 156/556; 156/583.1; 156/583.4; 118/60; 118/109
[58] Field of Search ............ 156/555, 556, 358, 583.1, 156/584, 247, 248, 249, 234, 344; 118/56, 60, 68, 100, 106, 109; 271/276; 242/156.1

[56] References Cited

U.S. PATENT DOCUMENTS

| | | | |
|---|---|---|---|
| 2,584,683 | 2/1952 | Elliott | 118/106 |
| 2,590,186 | 3/1952 | Land | 118/106 |
| 3,202,508 | 8/1965 | Heiart | 96/28 |
| 3,264,103 | 8/1966 | Cohen et al. | 96/28 |
| 3,716,221 | 2/1973 | Gorka et al. | 118/60 |
| 3,844,252 | 10/1974 | Thetto | 118/60 |
| 3,847,047 | 11/1974 | Jackson | 83/344 |
| 3,976,261 | 8/1976 | Lang | 242/128 |
| 4,369,246 | 1/1983 | Chen et al. | 430/306 |
| 4,423,135 | 12/1983 | Chen et al. | 430/271 |
| 4,580,738 | 4/1986 | Scheer | 242/55.2 |
| 4,585,509 | 4/1986 | Obayashi | 156/497 |
| 4,660,825 | 4/1987 | Umezawa | 271/276 |
| 4,818,330 | 4/1989 | Mosburger | 156/473 |
| 4,914,079 | 4/1990 | Takei et al. | 503/227 |

FOREIGN PATENT DOCUMENTS 1422942 11/1968 Fed. Rep. of Germany .

Primary Examiner—Michael W. Ball
Assistant Examiner—J. Sells
Attorney, Agent, or Firm—Kinney & Lange

[57] ABSTRACT

A device for forming a flexographic printing plate is disclosed. A preformed, imagewise irradiated sheet of film is heat treated by the device of the present invention to remove unwanted portions of a top layer, leaving radiation hardened relief images on the plate. The device has a heating means for supplying heat to said film, a first delivery means for delivering a sheet of absorbent material to a surface of the film, a second delivery means for supplying film to the heating means, pressure means for causing liquified material to be absorbed onto an absorbent material, and a separation means for separating the absorbent material from the film.

48 Claims, 12 Drawing Sheets

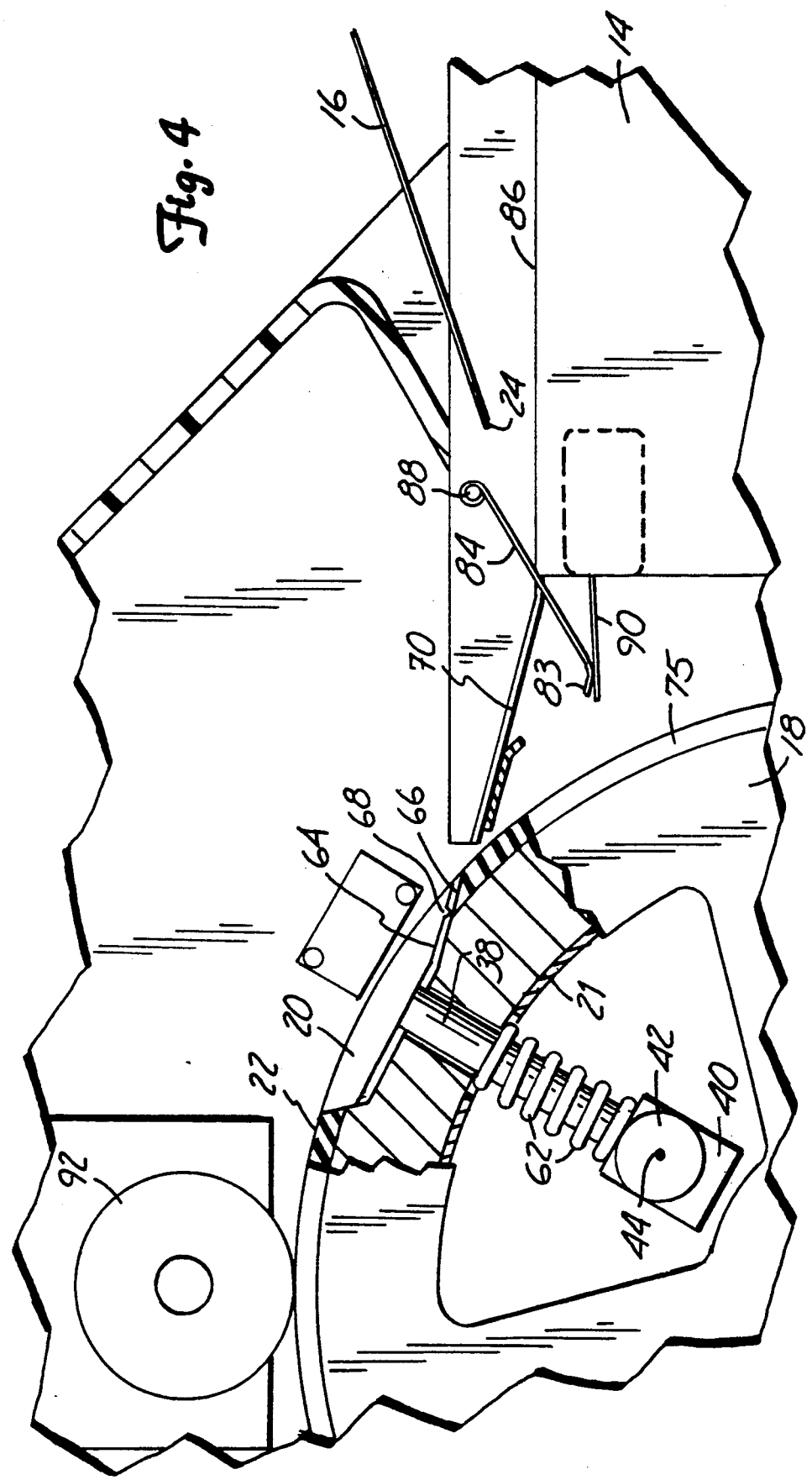

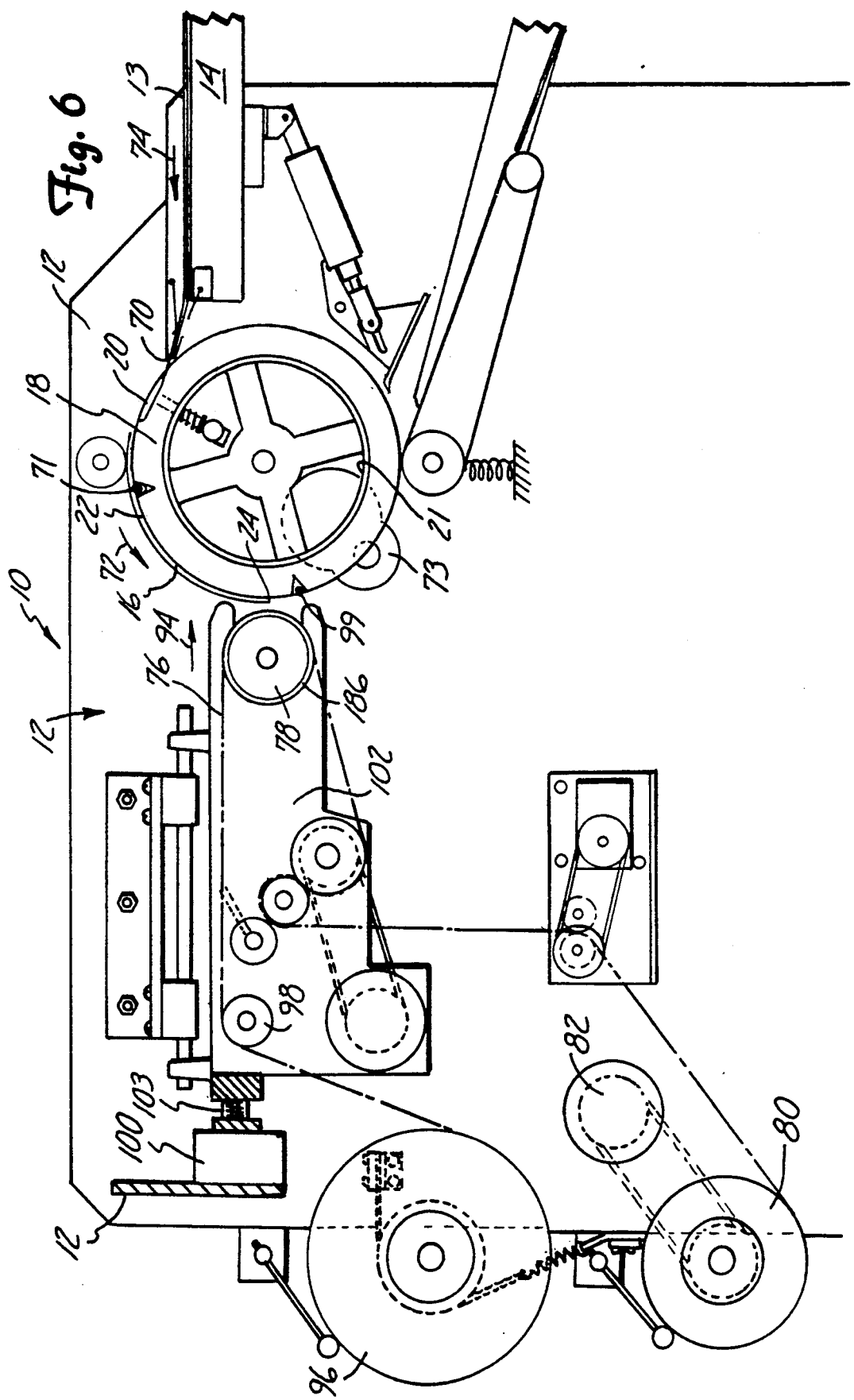

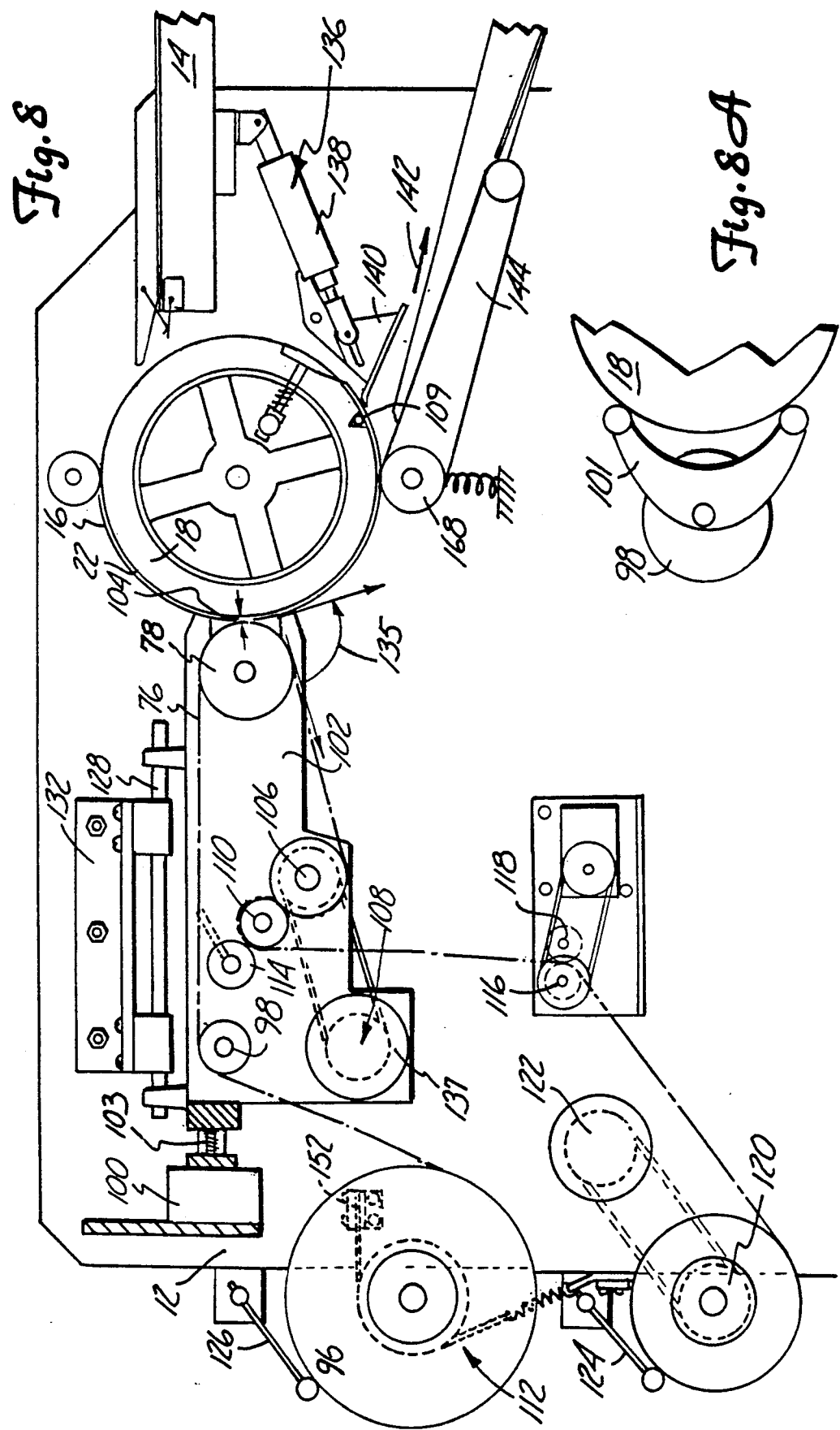

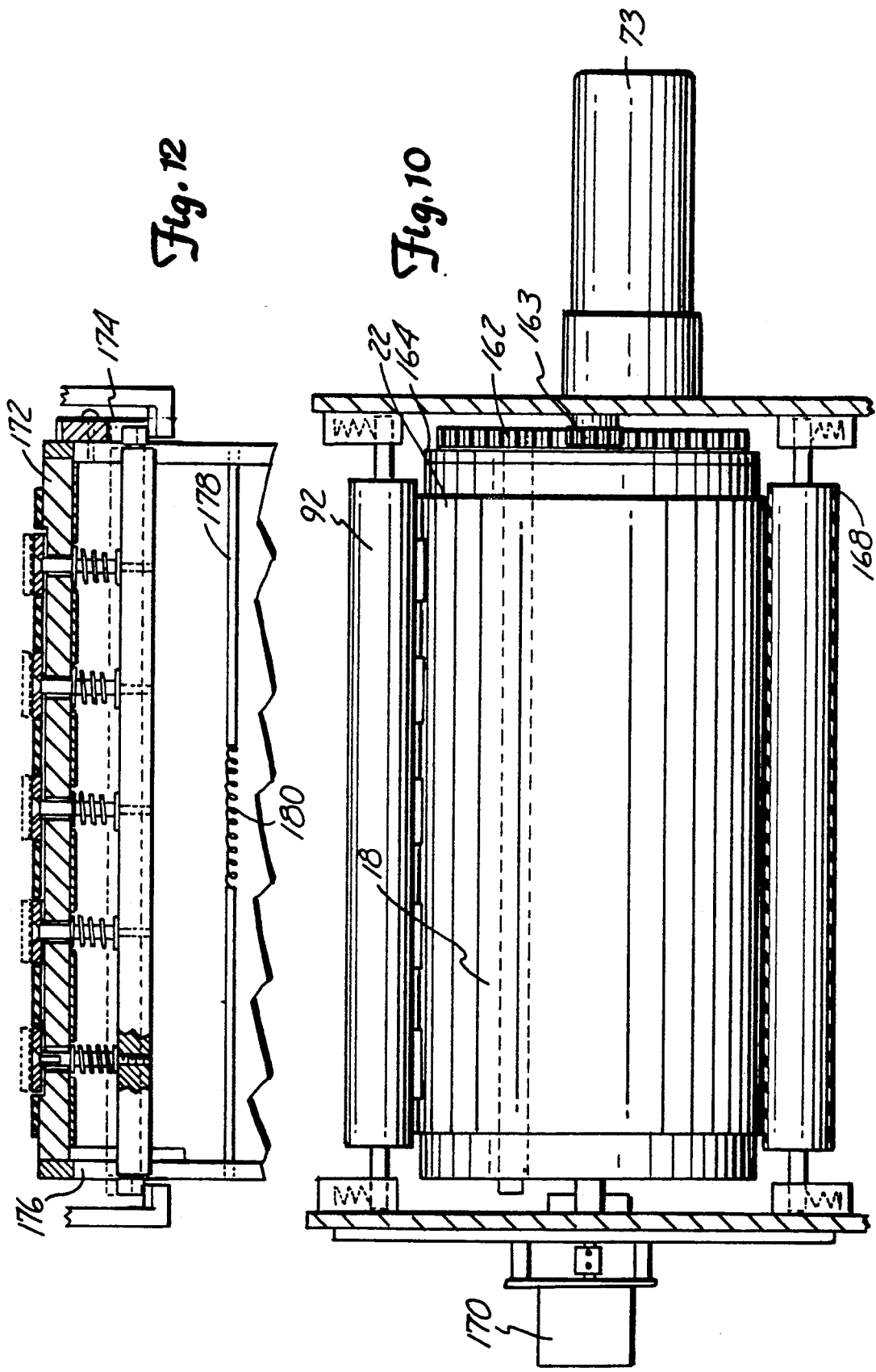

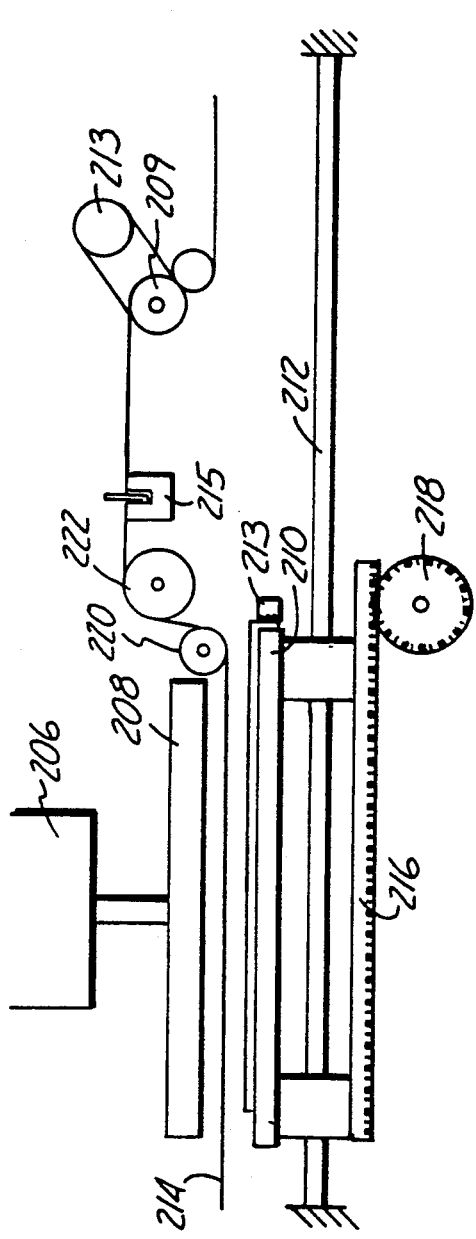
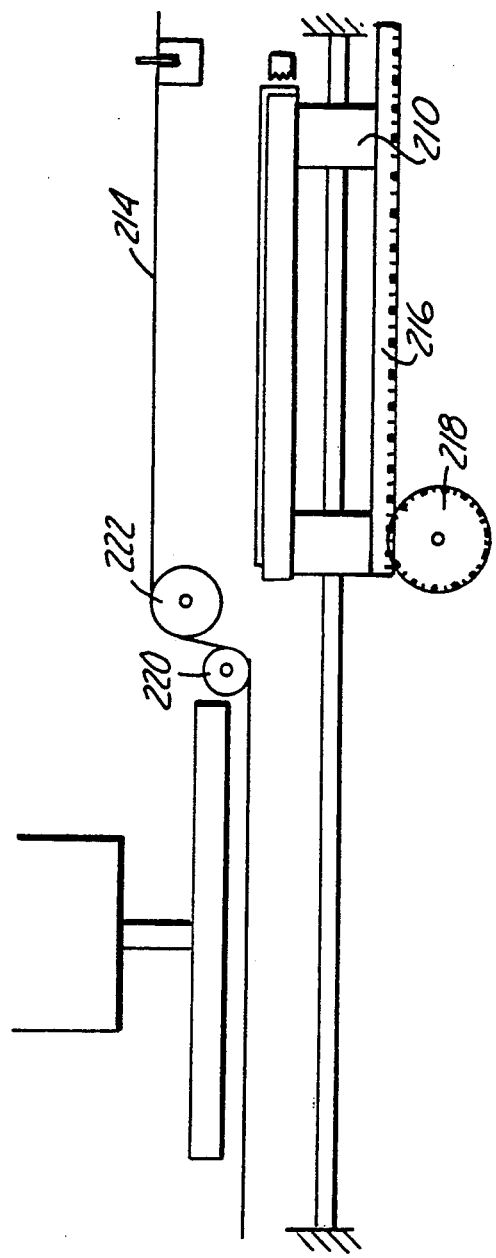
Fig. 15
Fig. 16

DEVICE FOR FORMING FLEXOGRAPHIC PRINTING PLATE

This is a continuation of application Ser. No. 07/560,619 filed on Jul. 31, 1990, abandoned as of the data of this application.

BACKGROUND OF THE INVENTION

The present invention relates to flexographic printing. In particular, it relates to devices for forming flexographic printing plates.

"Flexography" is a term that broadly applies to a printing format which uses a flexible substrate bearing an elastomeric or rubbery relief printing surface.

A "composite" film is one with multiple layers, the adjacent layers being formed from different materials.

"Elastomer" and "elastomeric" refer to rubbers or polymers having resiliency properties similar to those of rubber. In particular, elastomers are capable of being substantially elongated and then returned to their original dimensions upon release of the stress elongating the elastomer. In all cases an elastomer must be able to undergo at least 10% elongation (at a thickness of 0.5 mm) and return to its original dimensions after being held at that elongation for 2 seconds and after being allowed 1 minute relaxation time.

More typically an elastomer can undergo 25% elongation without exceeding its elastic limit. In some cases an elastomer can undergo elongation to as much as 300% or more of its original dimensions without tearing or exceeding the elastic limit of the composition. Elastomers are typically defined to reflect this elasticity as in ASTM Designation D883-866 as a macro-molecular material that at room temperature returns rapidly to approximately its initial dimensions and shape after substantial deformation by a weak stress and release of the stress. ASTM Designation D012-87 can be an appropriate procedure for testing rubber properties in tension to evaluate elastomeric properties. Generally, such compositions include relatively high molecular weight compounds which, upon curing, form an integrated network or structure. The curing may be by a variety of means, including: the use of chemical curing agents, catalysts, and/or irradiation.

The first flexographic printing plates were produced from natural or synthetic rubber compositions which were chemically cured under heat and pressure in a mold using conventional rubber curatives such as mercapto compounds. Recently, photopolymer elastomeric compositions (elastomer containing compositions curable upon exposure to actinic radiation) useful to produce relief printing plates have been described. For example, U.S. Pat. Nos. 4,369,246 and 4,423,135 describe solvent-insoluble, elastomeric printing relief plates which are formed by applying to a flexible polymer film substrate layer a layer of a photosensitive composition. A cover sheet is laminated to a surface of the photo-sensitive layer to form a flexible film. A Flexographic plate is then formed by stripping off the cover sheet, imagewise exposing the composition layer to actinic radiation through the film, and removing the film and unexposed areas of the composition layer by solvent washing. Another known plate forming process is similar to the process described above, except that the relief areas of the plate are produced by washing out the areas not exposed to radiation with an aqueous developer.

With both the aqueous and solvent washing methods described above, multiple processing steps are required which are time consuming and are therefore expensive. In addition, these technologies produce potentially toxic by-product wastes when forming flexographic plates.

Due to the limitations of the above-mentioned prior art methods of forming flexographic printing plates, a new family of radiation curable polyurethane elastomers was developed which has the advantage of being useful to form flexographic printing plates without requiring the use of solvents or aqueous wash systems. An application having the title *Flexographic Printing Plate Compositions*, Ser. No. 558,301 filed on Jul. 26, 1990, has been made for the above-mentioned flexographic printing plate compositions by John Martens, one of the co-inventors of the present invention.

A flexographic printing plate 11 formed by a compound disclosed in the Martens composition application is shown in cross-section in FIG. 1. The printing plate 11 has a first base layer 15 which may be a polymer or a metal. Preferred polymers include polyester, polycarbonate, or polyimide, for example. The base material can also be made of steel or aluminum, for example. The base material is selected to be tear resistant and must have a fairly high melt point, for example, above the melt temperature of the next layer formed on the base layer. A second substantially uniform layer 17 is applied onto the base layer. The second layer is formed of a radiation curable polymer such as a polyurethane elastomer. The elastomer layer may be adhesively or chemically bonded to the base material (not shown). The base layer in combination with the radiation curable polymer together forms a "flexible film."

The flexible film is next exposed to actinic radiation from a surface 23 of the base layer 15 to chemically cross-link and cure a portion of the second layer 17 to form a floor layer 25 as described in an application having the title *Flexographic Printing Plate Process*, by John Martens, a co-inventor of the present invention, Ser. No. 558,301, filed Jul. 26, 1990, hereinafter referred to as the Martens "process" reference. A portion of the film is imagewise exposed to actinic radiation from the opposite surface 27 and a visible image appears in the exposed areas of the radiation curable layer.

The portions 29 of the flexible film exposed to radiation chemically cross-link and cure. The cured portions have an elevated melting temperature, and are insoluble in flexographic printing inks under normal conditions. "Normal" conditions include printing plate temperatures of between about 12 degrees Centigrade and 31 degrees Centigrade.

An absorbent material is selected having a melt temperature exceeding the melt temperature of the unexposed or "uncured" portions of the radiation curable composition and having good tear resistance at the same operating temperatures. Preferably, the selected material withstands temperatures required to process the film at an unsteady state, for example, where the plate does not reach a state of thermal equilibrium during heating. The absorbent sheet contacts a surface 27 of the radiation curable layer of the heated flexible film, o and absorbs the liquified portions 31 of the elastomer off of the upper surface, forming a flexographic printing plate 11. As described in the Martens "process" application, it is necessary to bring the most preferred printing plate and a sheet of the most preferred absorbent material into contact three times to remove the liquified, uncured elastomer.

The printing plates as described in the Martens et al. "process" application are heated to between 40 and 200 degrees Centigrade and while in contact with the absorbent layer, the uncured composition liquifies and flows into the absorbent layer. It is preferred that most of the composition in the uncured areas be removed from the flexible substrate and e absorbed into the absorbent material.

It is also desirable that the elevated temperatures used to cause the uncured composition to flow (reduce its viscosity, or exceed its softening temperature, e.g., see ASTM designation D 1238-86) into and be absorbed by the absorbent layer should not distort the flexible substrate or the hardened composition by more than 2% in any surface dimension. The actual temperatures will vary with the specific substrate and composition used.

Following curing of portions of the elastomeric layer, the uncured portions are removed to reveal a raised structure which becomes the printing surface of the plate. The "relief" portions are the raised portions of the flexographic printing plate which are coated with ink and which contact print media. The relief structure is bound to the support layer by physical and/or chemical action and remains in place during the printing process through repeat impressions. The exposed surface of the cured elastomeric layer therefore becomes the ink receiving surface which both receives ink from the inking row and transfers it to the substrate to printed during the printing process.

The hardening or curing step of the process (by irradiation) can also act to increase the adhesion of the composition to the substrate. This can be by direct adhesion of the curing composition to the substrate, for example, either chemical adhesion by reaction or physical adherence to surface structure on the flexible layer. The primer layer may be photosensitive or photoinsensitive to aid in this adherence effect. Flexographic plates having a layer for forming relief images are preferably formed from polymers which have a low melt temperature, a high melt index, are radiation curable, and are elastomeric polyurethane compositions. The composition should have sufficient resistance to swelling after curing. The cured elastomer compositions should be particularly resistant to increases in volume and swelling when immersed in flexographic inks, such as water based inks utilized in the flexographic printing process. This low swell feature is critical to the ultimate printing quality achieved with the printing plate because swelling causes the dimensions of the relief image to enlarge.

The press life or wear life of the plate on press (the number of impressions until failure occurs) may also be greatly reduced by swelling which may result in a loss of physical strength of the cured elastomer composition. Radiation curable polyurethane printing plates cure or cross-link when exposed to actinic radiation without the need of additional vinyl containing monomeric additives, such as monomers containing more than one vinyl group per molecule. Using a curing process which does not require the use of solvents avoids the harmful effects on the environment caused by pollution.

Radiation curable elastomer coated sheet material is resistant to cold flow during storage. Elastomers which undergo too much cold flow result in printing plates having unacceptable variation in plate thickness. The radiation curable polyurethane elastomers have good to superior resistance to cold flow prior to irradiation induced cross-linking or curing.

The use of flexographic printing plates is popular because the process is a "direct" printing process. The printing plate and its temporarily bound ink layer are in direct contact with the substrate, for example, the paper or film being printed. Before the Martens inventions, no devices existed to process flexographic printing plates by liquefying a portion of the flexible sheet, and removing the liquefied portions with an absorbent material.

SUMMARY OF THE INVENTION

The present invention is a mechanical device for forming a flexographic printing plate, the plate preferably being formed from a sheet of imagewise irradiated film formed according to the flexographic printing plate process disclosed in the Martens "process" reference. The device forms a flexographic printing plate from a sheet of film having at least one layer capable of being partially liquefied. The device includes heating means for applying heat to the sheet of film for an amount of time and at a temperature sufficient to cause a portion of the layer to liquefy. The most preferred heating means includes an electrical heating blanket. The blanket is mounted onto an inner surface of a rotatable preheating drum which supports the sheet of film and preheats the film to a temperature near the melting point of the uncured portions of the layer. The heating means of the preferred embodiment also includes an electrical core heater mounted in a substantially cylindrical cavity of a hot roller. The core heater heats the hot roller to an outer skin temperature which exceeds the melting point of the uncured portions of the film.

The preferred embodiment also includes a first delivery means for supplying an absorbent material to a surface of the layer. In the preferred embodiment, the first delivery means includes a motor which rotates a drive shaft, which in turn rotates a drive roller capable of pulling a continuous web of absorbent material from a supply roll, over a hot roller. The absorbent material contacts the hot surface of the hot roller. The present invention also includes a second delivery means for delivering a sheet of film to the heating means comprising a rotating preheating drum having a transversely positioned clamp, the clamp securing the leading edge of the sheet of film onto the outer surface of the preheating drum as the drum rotates. The drum is heated with an electrical blanket in the preferred embodiment to bring the film up to near the melt temperature of the uncured portions of the polymer layer.

The present invention also includes pressure means for causing a surface of the film and the absorbent material to come into face-to-face contact. The pressure means in the preferred embodiment includes a series of springs for biasing the hot roller against the preheating drum. A pneumatic cylinder is provided which drives the heating roller and absorbent web toward and in to contact with a surface of the sheet of film which in turn contacts the film on the preheating drum. The pressure means in the preferred embodiment applies pressure sufficient to cause at least a portion of the liquified material to be absorbed by the absorbent material. The present invention also includes separation means for separating the film from the absorbent material, immediately after the desired amount of liquified material is removed from the plate.

BRIEF DESCRIPTION OF THE DRAWINGS

FIG. 4 is a detailed side cross-sectional view of the second delivery means.

FIG. 6 is side a cross-sectional view partially in schematic of first embodiment of the present invention.

FIG. 8 is side cross-sectional view partially in schematic of the present invention with the hot roller engaged.

FIG. 8A is a detailed side elevational view of the pressure limiting device of a preferred embodiment of the present invention.

FIG. 10 is a side elevational view of the preheating drum.

FIG. 12 is a side cross-sectional view of the drum taken along line 12—12 as shown in FIG. 2.

FIG. 15 is a schematic view of the third preferred embodiment of the present invention, with the base member positioned for engagement with the hot plate.

FIG. 16 is a schematic view of the third preferred embodiment of the present invention, with the base member moved away from the hot plate.

DETAILED DESCRIPTION OF THE PREFERRED EMBODIMENTS

Figure 1:
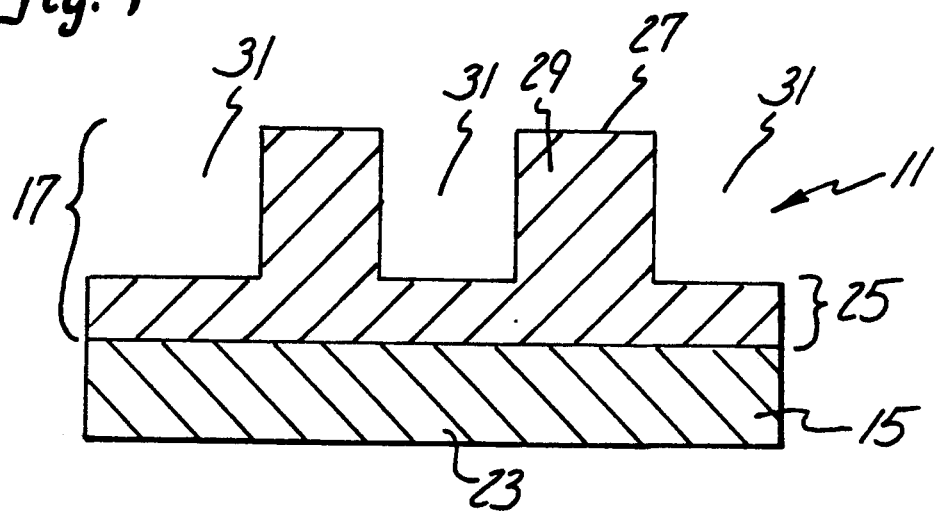
FIG. 1 is a schematic cross-sectional view of a formed printing plate, showing a multilayered construction.

The present invention is a device for heat developing flexographic printing plates. A first preferred embodiment of a device of the present invention is a plate processor 10 shown in FIG. 2. The plate processor 10 of the present invention accepts a previously formed and previously imagewise actinic radiation exposed flexible sheet 16, the sheet having a base layer and an adjacent layer of a radiation hardenable elastomer material (curable layer). The base layer has a preferred thickness of between about 0.1270 mm and about 0.1778 mm, with a preferred thickness of about 0.1778 mm. The radiation curable layer is between about 0.3556 mm and about 0.8890 mm thick, with a preferred thickness of about 0.5080 mm thick. A portion of the radiation curable layer is cured by actinic radiation through the lower surface 23 of the base as shown in FIG. 1 to form a cured "floor 25." Next, the film is imagewise exposed from the opposite surface 27 to cure the desired portions of the plate. The floor 25 is between 0.1778 mm and about 0.2540 mm thick with a preferred thickness of about 0.1778 mm.

The remaining portion of the radiation curable layer 17 after curing consists of cured portions 29 and uncured portions (not shown). The layer containing cured as well as uncured portions has a thickness between about 0.1778 mm and about 0.6350 mm, with a preferred thickness of about 0.3800 mm.

Examples of flexible film compositions suitable for forming the curable layer are disclosed in an Application having the title *Flexographic Printing Plate Compositions*, applied for by John Martens, on Jul. 26, 1990. Ser. No. 558,301, which is herein incorporated by reference (Martens "composition" application). Although the most preferred embodiment of the invention heat develops a radiation curable polyurethane elastomer disclosed in the Martens "composition" application, the device of the present invention is adaptable to heat develop other flexographic printing plate films such as PLS Printing Plates manufactured by E. I. Du Pont de Nemours & Co. of Wilmington, Del. Before the present invention, the PLS printing plates were developed using solvents. Although PLS printing plates can be processed on the device of the present invention, the Du Pont product is less suitable than the Martens printing plates because the Martens plates do not emit fumes during heat processing as do the PLS print plates. The device of the present invention is also not limited to heat developing flexographic printing plates. The present invention contemplates a device capable of heating a layer of flexible film capable of being partially liquified to a temperature sufficient to melt at least a portion of a layer of the flexible film for any purpose.

For purposes of illustration only, a device capable of heat developing flexographic printing plate film disclosed in the Martens "composition" application will be described. In particular, the first preferred embodiment is adapted to process film available by ordering a 3M Brand Flexoplate ™ from the Minnesota Mining and Manufacturing Company of St. Paul, Minn. (3M).

Figure 2:
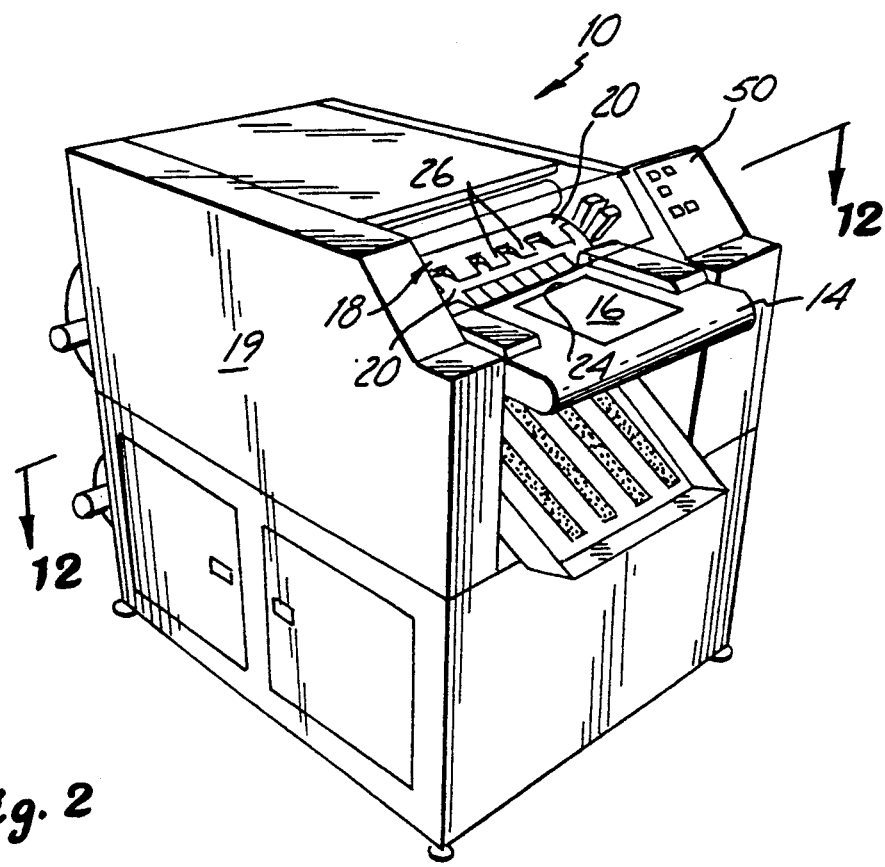
FIG. 2 is a perspective view of a first preferred embodiment of the device of the present invention.

The first preferred embodiment of the present invention as shown in FIG. 2 includes a support frame 12 (shown schematically in FIG. 6) and a feed tray 14 mounted onto the support frame 12, the feed tray i4 being of a size and a shape suitable for accepting a flexible sheet of film 16.

Although the size of the sheets suitable for being developed by the plate processor 10 is unimportant to the present invention, the first preferred embodiment is capable of processing sheets 14 up to about 35.56 centimeters in width and up to about 71.12 centimeters in length. The most preferred film dimensions are about 22.54 centimeters in width by about 43.18 centimeters in length. The most preferred total composite film thickness is between about 0.4826 mm and about 1.0668 mm, with a preferred thickness of about 0.5715 mm (the thickness of the above-mentioned 3M product).

Prior to using a device of the present invention to heat develop a sheet of film 16 to form a flexographic printing plate, a template or mask is placed over the film and the film is imagewise exposed to actinic radiation to harden a portion of the radiation curable layer. The Martens patent application having the title *Flexographic Printing Plate Process*, Ser. No. 558,301, filed Jul. 26, 1990 (Martens "process" patent) discloses the most preferred method of forming, irradiating, and heat developing a flexographic sheet. The Martens "process" application is herein incorporated by reference.

The Martens process is briefly described below. A composite film as described in the Martens "composition" reference is formed. The film is imagewise irradiated, and then is heated to between 40 upon the exact composition selected. As the film temperature approaches the melting temperature of the uncured portions of the radiation hardenable composition layer, the film comes into contact with a preheated absorbent web of nonwoven material. The most preferred nonwoven material is available from the James River Corporation of Richmond, Va. under the trade name "Cerex. TM" The heat in the absorbent web is transferred to the flexible film upon contact, and the temperature of the flexible film is raised to a temperature sufficient to enable the uncured portions of the composition layer to liquify and be absorbed into the absorbent layer.

Pressure is applied to force the absorbent web into intimate contact with the film. The most preferred contact force is not known. However, it is believed that between about 0.703 kilograms per square centimeter and about 7.03 kilograms per square centimeter is adequate to enhance the absorption from the film surface to the absorbent web without distorting the composite film.

At least 75% of the liquified composition in contact with the absorbent web is absorbed. In the preferred embodiment, most of the uncured portions are removed. The web is then removed from the film immediately after absorption, before the molten polymer is able to resolidify. The molten material then resolidifies in the absorbent web.

The plate processor 10 of the present invention includes a preheating drum 18 which in the illustrated embodiment rotates counter-clockwise from the first side 19 of the machine. The preheating drum 18 is elevated to a temperature sufficient to raise the temperature of the uncured portions of the radiation curable layer near its melt point. In the preferred embodiment, the preheating drum is operated at a temperature between about 120 and about 177 degrees Centigrade, with a preferred operating temperature of about 173 degrees Centigrade.

At the same time, the substrate layer is of a much higher melt temperature, for example, exceeding the operating temperature of the preheating drum 18, and therefore the mechanical properties of the substrate are not significantly altered by this preheating step.

The preheating drum 18 has a flush mounted clamp 20 mounted transversely on the outer surface 22 of the drum for securing a leading edge 24 of the flexible sheet of film 16 to the outer surface 22 of the drum. The clamp 20 in the preferred embodiment is elongated and has a plurality of teeth 26 extending tangentially in a direction opposite the direction of rotation of the drum. In operation, the clamp 20 is raised radially outward and off of the outer surface 22 of the preheating drum 18 by an actuator means 28 shown in FIG. 3. In the preferred embodiment, the actuator means 28 is a pair of pneumatic cylinders 30, mounted onto the frame 12, and positioned on opposite ends of the preheating drum 18. The pneumatic cylinders are mounted radially at approximately a 30 degree angle from the vertical. The pneumatic cylinders 30 each have an end 32 (shown in FIG. 5) with a stop 34 which exerts a radial force away from the axis of rotation 36 (into the paper) of the preheating drum 18. The operation of the actuation means 28 will be more clearly understood by first examining the features of the clamp 20 as shown in FIG. 4.

The clamp 20 is substantially elongated. In the preferred embodiment, the clamp 20 extends the full width of the film 16. In the preferred embodiment, the clamp is about 36.83 centimeters wide. A plurality of support legs 38 are fixedly mounted onto a lower surface of the clamp 20, and extend through the drum wall and into the interior portion of the preheating drum 18. The support legs 38 in the preferred embodiment are cylindrical, and are fixedly connected to a transverse rod 40 which in the preferred embodiment is formed from rectangular bar stock.

At each end of the transverse rod 40 is a cam follower 42 rotationally mounted along an axis 44 passing substantially through the center of the rod 40. The cam followers 42 in the preferred embodiment are substantially cylindrical. The length of the rod 40 without the cam followers 42 in the preferred embodiment is slightly shorter than the width of the drum 18, and the cam followers 42 extend outwardly of the sides of the drum 18.

Figure 5:
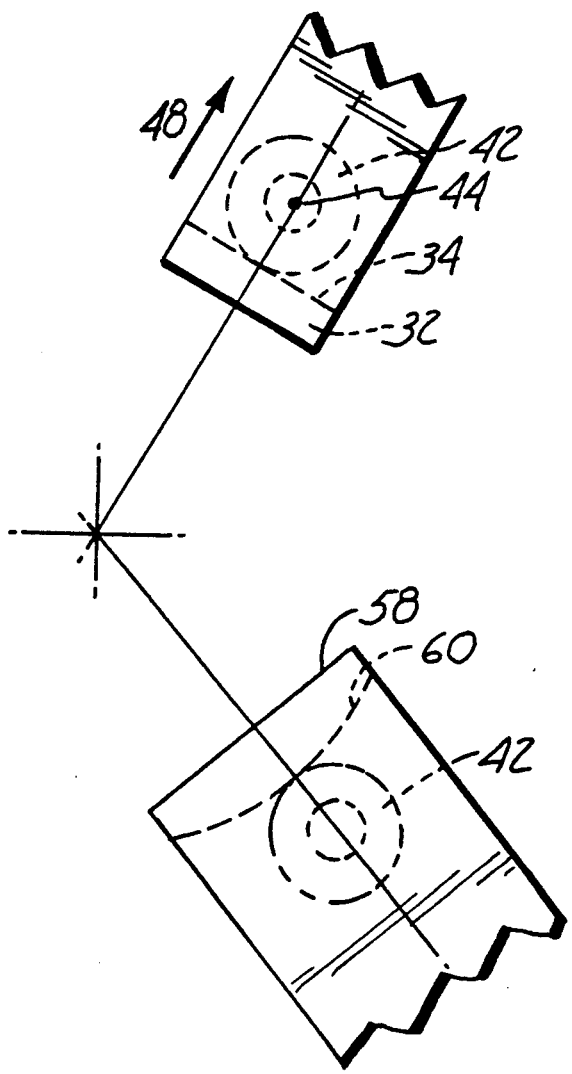
FIG. 5 is detailed drawing of the pneumatic cylinder ends.
Figure 7A:
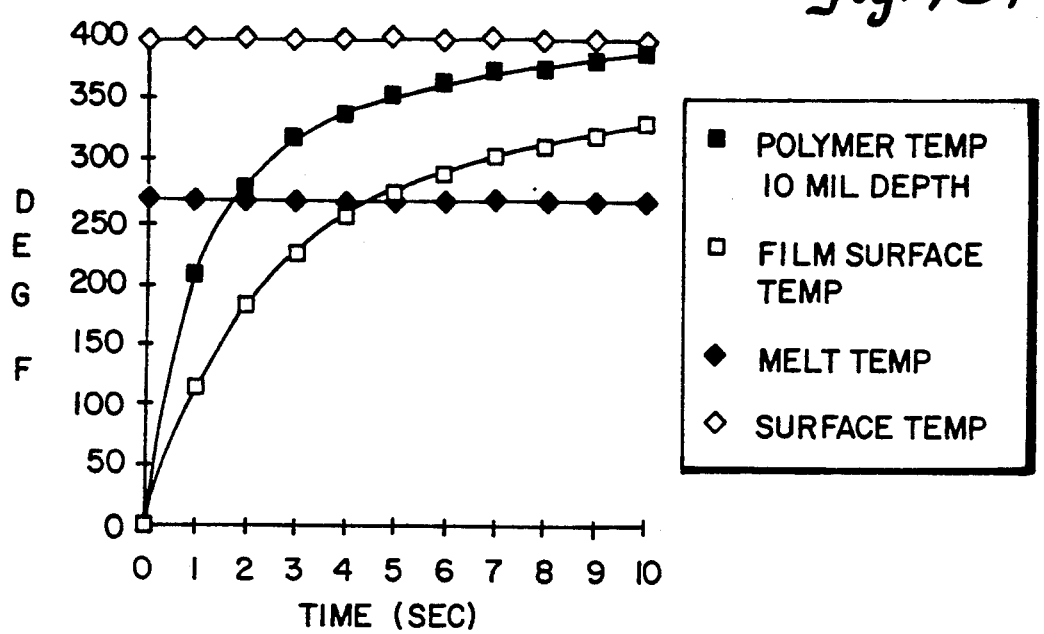
FIGS. 7A-7D are a series of heat up curves used to form the present invention.
Figure 7B:
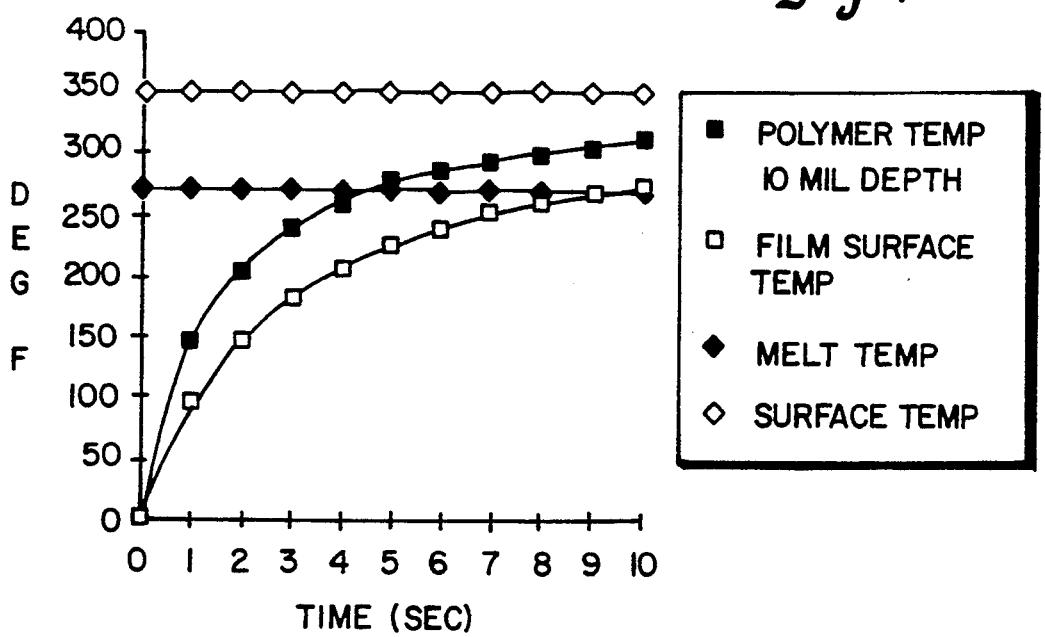
Figure 7C:
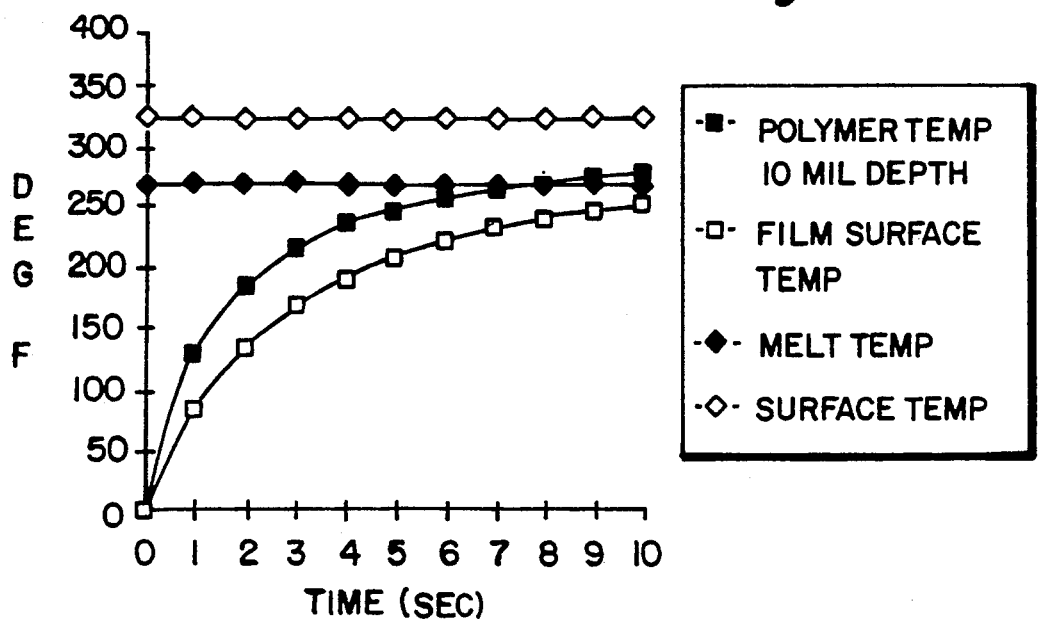
Figure 7D:
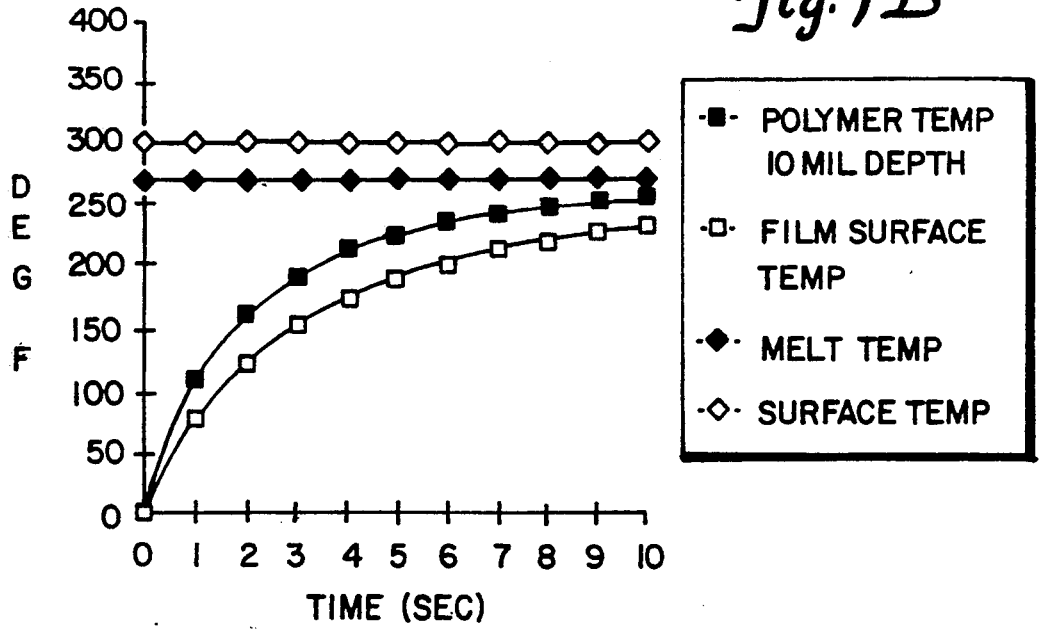

A first end 32 as shown in FIG. 5 of pneumatic cylinder 30 retracts in a direction shown by arrow 48 in response to a signal from the controller (not shown). The controller (not shown) is programmable and operable from a control panel 50 (shown in FIG. 2). The control panel in the preferred embodiment includes many features such as an on/off switch, a selector switch for selecting the number of cycles per sheet required, an open and close switch to operate clamp 20, a plurality of indicator lights for determining the cycle the machine is in and L.E.D. readouts to indicate operating temperatures, for example.

Figure 3:
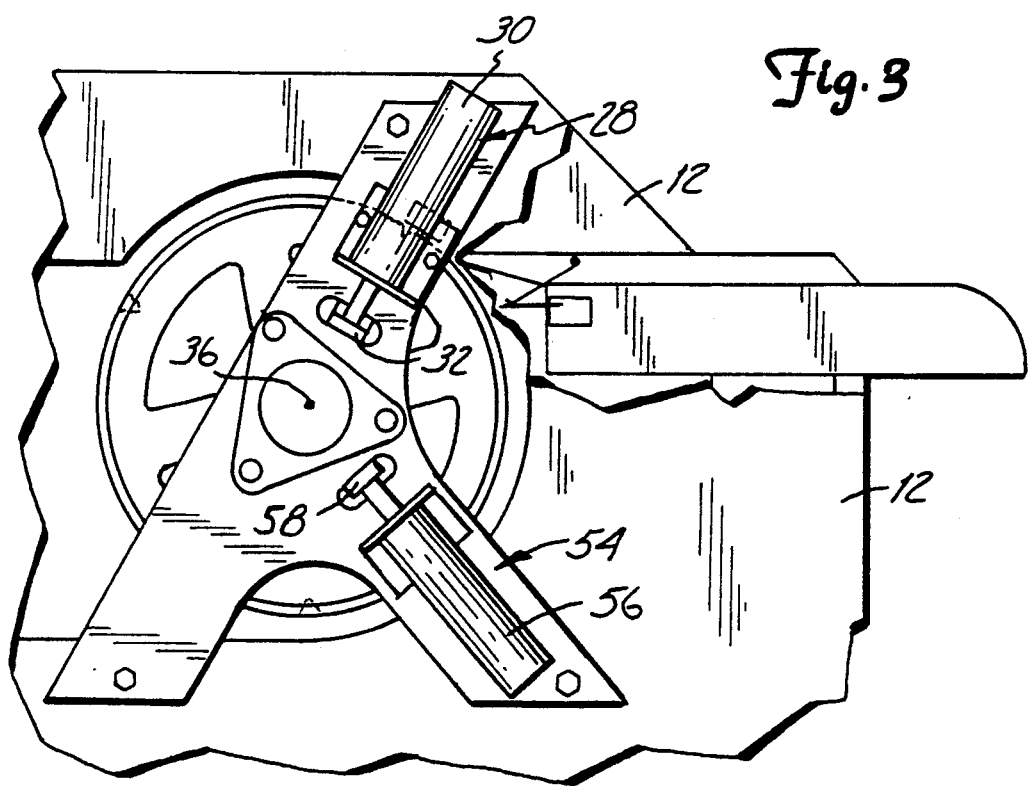
FIG. 3 is a detailed side elevational view of the actuators of the first preferred embodiment.

Each first end 32 has a stop 34 which extends in a direction substantially parallel to a central cylinder axis 44 of the cam follower 42. The stop 34 engages the cam follower 42, and allows the pneumatic cylinder 30 (shown in FIG. 3) to lift the transverse rod 40 and clamp 20 upwardly (shown in FIG. 4), away from the central rotational axis 36 (as shown in FIG. 3) of the drum 18. The clamp 20 is opened by a manual switch when the preheating drum 18 is at rest. The first preferred embodiment also has a second pair of actuators 54 as shown in FIG. 3 which are also pneumatic cylinders 56, and are rigidly mounted onto the frame 12. The pneumatic cylinders 56 each have a first end 58 having a stop 60 (shown in FIG. 5) for receiving the same cam followers 42 at a different rotational location and when the preheating drum 18 is in motion. The size and shape of the stops 60 are curved and larger than stops 34 because stops 60 engage the cam followers 42 during rotation, while stops 34 engage the same cam followers 42 when stationary.

Referring back to FIG. 4, between the clamp 20 and the transverse rod 40 and fixedly attached to the clamp 20 and the rod 40 are support legs 38. Tensioning springs 62 extend around each support leg 38 and hold the clamp 20 substantially flush with the outer surface 22 of the drum when no other forces are being applied to the cam followers 42.

The clamp 20 must lift to a height sufficient to provide enough clearance for inserting the leading edge 24 of the flexible sheet of film 16 into an opening defined by a lower surface 64 of the clamp 20 and a clamp receiving surface 66 of the preheating drum 18. The sheet 16 need only be positioned about 1.27 centimeters under the teeth 26 of clamp 20 to hold the sheet into place.

The lower surface 64 of the clamp 20 has a downwardly projecting edge 68 which tightly grips the film 16 and holds the film 16 in place on the drum 18.

Upon activating the control panel 50 (shown in FIG. 2), the preheating roller 18 should be in the "start" position. If not, the controller actuates the preheating drum drive motor 73 (shown in FIG. 6) and advances the preheating drum 18 to the "start" position, where the clamp 20 is slightly above a front edge of a feed plate 70. A cam activated microswitch 71 (shown in FIG. 6) sends a signal to the controller to stop the drum when the drum 18 reaches the "start" position.

Feed plate 70 is inclined slightly to urge the leading edge 24 of the sheet 16 toward the clamp 20. A manual switch (not shown) is energized in the preferred embodiment to activate the pneumatic cylinders 30 (shown in FIG. 3) which lift clamp 20 upwardly and holds the clamp 20 in an "open" position. A second manual switch (not shown) is activated, closing the clamp. A third "start" switch (not shown) activates a control sequence. After the "start" switch is activated, the drive motor 73 (shown in FIG. 6) begins to rotate the drum 18. The drum 18 rotates at a preferred speed of about 40.64 linear centimeters per minute, as measured on the drum surface.

The preheating drum 18 in the first preferred embodiment is equipped with a preheating means which is an electrical heating blanket 21, available from the Watlow Electric Company of St. Louis, Mo. The most preferred heating blanket is a wire wound blanket, having a 0.1143 cm. thickness, a 45.72 cm. width, and a 60.96 cm. length. The heating blanket has a 2000 watt capacity and requires a 220 volt energy supply. Any means of heating the drum is acceptable, as long as the power capacity of the heating means is sufficient to maintain a fairly constant selected skin temperature on the outer surface of the preheating drum 18 of about 173 degrees Centigrade.

The preheating drum 18 in the preferred embodiment is coated with a silicone rubber composition layer 75 having a Shore A hardness rating of about 55. The most preferred rubber coating is 3/16 inch thick silicone rubber and is impregnated with aluminum particles. This type of rubber coating is available from Robinson Rubber Products Company, Inc. of New Hope, Minn. It is believed that the aluminum particles improve the heat transfer characteristics of the drum by between 10 to 20 percent.

The hardness of the coating layer 73 is important, although not critical to the invention. Flexible coatings having a Shore A hardness between about 30 and about 60 are suitable for covering the preheating drum 18 of the present invention.

The most preferred embodiment of the present invention is shown schematically in FIG. 6. The preheating drum 18 is mounted for rotation on a stationary support frame 12 and rotates in a counterclockwise direction as indicated by arrow 72. A sheet of film 16 (shown in FIG. 2) is placed on a surface 13 of a feed tray 14 and is urged in a direction indicated by arrow 74. The leading edge of a flexible sheet of film 16 is inserted into clamp 20. The sheet 16 remains on the surface 22 of the preheating drum during processing.

The plate processor 10 of the present invention includes a delivery means for feeding a continuous web 76 of nonwoven material which in the preferred embodiment contacts a hot roller 78. The hot roller 78 elevates the temperature of the web 76 to a temperature exceeding the melt temperature of the upper layer of the film. The heated web transfers heat to the flexible sheet of film, melts a portion of the layer and absorbs at least a portion of the liquified polymer.

In the first preferred embodiment of the present invention, a take-up roll 80 is provided for winding the nonwoven material after processing. In the preferred embodiment, the take-up roll 80 is independently belt driven by a variable speed motor 82.

Although the specific type of absorbent material is not critical to the present invention, the most preferred nonwoven material is Cerex TM, a nylon random web nonwoven material manufactured by the James River Corporation of Richmond, Va. The selection of the web material 76 depends in large part upon the thickness of the flexible sheet of film 16 to be processed, the melting temperature of the absorbent material, the heat transfer characteristics of both the flexible sheet of film 16, and the nonwoven material, and the strength of the absorbent material during the separation of the material from the film 16.

In order to determine the processing temperatures, speeds and other design criteria, it is first necessary to select the type of flexible sheet of film 16 to be processed and then to study its heat transfer characteristics.

A substantially rectangular hot plate was provided to collect the heat transfer data on the most preferred film. The temperature of the hot plate was raised to a temperature above the melt temperature of the irradiation curable layer, and maintained at that temperature for the first experiment. The most preferred absorbent material (Cerex TM) was placed on the hot plate. Then a sheet of the flexible film, substrate side up was placed on the absorbent material. The surface temperature of the hot plate, as well as the temperature of the back of the base layer were measured over time.

A plot of polymer temperature at the film surface, at a 0.254 millimeter depth in the polymer was generated. A 0.5842 millimeter thick test film was used in the experiments. Temperature was plotted on the Y axis and time was plotted on the X axis. The curves were hyperbolic in shape and asymptotic to the controlled surface temperature of the hot plate. FIGS. 7A–7D are heat up curves for film composition (3M Flexoplate TM manufactured by Minnesota Mining and Manufacturing of St. Paul, Minn.) at various temperatures. The temperature of the hot plate was selected as a temperature exceeding the known melt temperature of the uncured portions of the flexible film.

Based on the shape of the curve of Film Surface Temperature v. Time, data was fitted into an equation of the type:

$$Temperature = Time/(a + b \times Time)$$

The above-mentioned equation forms a straight line when time/temperature is plotted against time. The equation was solved for constants a and b at two different temperatures as well as at two different composite film thicknesses. Constants a and b were computed for various temperatures and thicknesses as summarized in Table I.

TABLE I

| Constants | | Temperature | Thickness |
|---|---|---|---|
| a | b | (Degrees F.) | (Mils) |
| 0.019 | 0.00392 | 250 | 29 |
| 0.012 | 0.00383 | 250 | 16 |
| 0.017 | 0.00287 | 365 | 29 |
| 0.0067 | 0.0027 | 365 | 16 |

The correlation coefficients for the above equations were each greater than 0.90.

Next an equation was generated to relate constants a, b, the temperature and the thickness of the plate. The following model assumes that all materials at the beginning of testing are at room temperature, and that the heat conductivities of each of the materials are equal.

$$a = 8.46 \times 10^{-3} - 3.17 \times 10^{-5} \times temp + 6.65 \times 10^{-4} \times thickness$$

$$b = 6.02 \times 10^{-3} - 9.43 \times 10^{-6} \times temp + 9.61 \times 10^{-6} \times thickness$$

The temperature units were in degrees Fahrenheit and the thickness units were in mils (0.0254 mm/mil).

These relationships were used to generate curves relating temperature and a given depth in the polymer versus various surface temperatures and times.

The model was used to create curves for four different surface temperatures (263, 227, 209, and 191 degrees Centigrade). The model also assumed that sufficient energy was provided to the plate to maintain a constant plate temperature. Based on the heat-up curves of FIGS. 7A-7D, a heating temperature of about 243 degrees Centigrade was selected as a starting point in determining the maximum running speed and the heating temperatures of the hot roller 78.

In the most preferred embodiment, the preheating drum 18 as shown in FIG. 6 has an outer diameter of approximately 25.88 centimeters and a width across the drum of about 48.26 centimeters. In order to adequately preheat the flexible sheet of film 16, it is necessary to heat preheating drum 18 to a selected temperature of approximately 173 degrees Centigrade, plus or minus about 5 degrees for a selected drum speed of about 40.64 linear centimeters per minute.

The preheating drum 18 in the preferred embodiment is of a size sufficient to process a sheet of film having up to a 71.12 centimeter length as measured in the direction of travel of the sheet. Also, for a drum width of 48.26 centimeters, the maximum width of a sheet of film 16 to be processed would be about 35.56 centimeters. Any size flexible sheet which is smaller than the stated maximum dimensions could be processed on the plate processor 10 of the first preferred embodiment.

A controller (not shown) is provided and is programmable by a control panel 50 (shown in FIG. 2). When the machine is turned on, the preheating drum 18 is in the "start" position. In the "start" position, a trailing edge of the clamp 20 is in close proximity with the feed plate 70 shown in detail in FIG. 4. A guide plate 84 is pivotally mounted above the feed surface 86. As the trailing edge of the flexible sheet of film 16 passes the leading edge 83 of guide plate 84, the guide plate pivots downwardly along pivotal axis 88 (into the paper) and engages a switch 90 generating a signal which is sent to and processed by the controller (not shown) to compute a "length" for the sheet of film. The controller uses this value at the end of the processing cycle to determine when to disengage the absorbent web 76 from the flexible sheet 16.

Clamp 20 holds the leading edge of the flexible sheet 16 onto an outer surface of the preheating drum 18 while the drum is rotating. A steady roller 92 is provided to hold the sheet 16 onto the drum surface 22 during rotation. The most preferred rotation speed is about 40.64 linear centimeters per minute at the drum surface 22. From the previous discussion, it would be possible to run the machine faster by increasing the operating temperature of the preheating drum 18. It would also be possible to operate the machine slower at a lower preheating temperature.

Steady roller 92 is positioned at approximately the uppermost location on the drum 18 in the preferred embodiment to eliminate air between the film 16 and the outer surface 22, and to apply a radial force to improve heat transfer 92.

Referring back to FIG. 6, in order to raise the outer surface temperature of the flexible film 16 to a temperature which exceeds the melt temperature of the uncured portion of the radiation curable layer, a hot roller 78 is moved in the direction shown by arrow 94 until its outer surface contacts the leading edge 24 of the flexible sheet 16.

The hot roller 78 in the first preferred embodiment is driven by friction between its outer surface and the absorbent web 76 contacting the roller 78. It is critical to the present invention that the linear speed of the hot roller 78, the web 76, and the film 16 be substantially the same to avoid any shear stress on the film. Such stress is known to cause uneven relief portion plate thickness, which is undesirable. The hot roller 78 rotates in a direction opposite the direction of rotation 72 of the preheating drum 18.

The web 76 originates from a supply roll 96 of absorbent material which in the preferred embodiment is mounted for rotation onto the stationary support frame 12. The web 76 of absorbent material passes over a first idler roller 98 which is positioned to deliver the web substantially horizontally to the hot roller 78. The absorbent material comes into face-to-face contact with the hot roller 78 which in the preferred embodiment is operated at a temperature of about 234 degrees Centigrade. Although the mos preferred operating temperature of the heating roller is about 234 degrees Centigrade, it is known that the upper limit is determined in large part by the melting temperature of the web material 76 which in the preferred embodiment is about 245 degrees Centigrade. Another temperature limitation is the melt temperature of the substrate. The substrate of the most preferred embodiment is a polyester film having a melt temperature of about 220 degrees Centigrade. Because the heat transfer is not at a steady state, hot roller 78 temperature of up to 245 degrees Centigrade does not melt the substrate. The hot roller 78 temperature must also be low enough so that when the web 76 is not moving and the portions of the web contacting the hot roller 78 are at rest, the web 78 does not melt.

The controller (not shown), after measuring the length of the flexible sheet 16, and after receiving a signal from a cam operated microswitch 99 indicating that the leading edge 24 is at a point nearest the hot roller 78, actuates a pneumatic cylinder 100 which is fixedly mounted onto the stationary frame 12. The cylinder 100 extends, causing a movable frame 102 supporting the idler roller 98 and the hot roller 78 to move in a direction designated by arrow 94. In the preferred embodiment, tensioning springs 103 are provided between cylinder 100 and frame 102 to urge hot roller 78 against the film 16 at a selected pressure after the cylinder 100 has delivered the hot roller 78 to the "engaged" position.

FIG. 8 is a schematic side elevational view of the device 10 with the hot roller 78 engaged. The nip 104, or distance between the hot roller 78 and the preheating drum 18 when the heating roller 78 is in the engaged position for this preferred embodiment is zero centimeters. It is desirable to set the distance such that a substantially uniform pressure of between about 2.109 kilograms per square centimeter and about 4.921 kilograms per square centimeter, with a preferred pressure of about 3.163 kilograms per square centimeter is applied to a surface of the flexible sheet of film 16 during processing.

FIG. 8A shows a pressure limiting device 101 mounted onto a rotational shaft of the hot roller 78. The device 101 rides on an outer edge of drum 18 and limits the pressure exerted on the film 16.

Referring back to FIG. 8, as the web 76, passes over the hot roller 78, its temperature is rapidly elevated to a temperature which must exceed the melt temperature of the polymer coating on the flexible sheet of film 16. The cylinder 100 in FIG. 8 is in the extended position, with the heating roller 78 contacting the outer surface 22 of the preheating drum 18 and in intimate contact with both the web 76 and an outer surface of the flexible sheet 16. As the sheet 16 passes through the nip 104, a portion of the polymer coating liquifies and is absorbed into the web 76. According to the preferred embodiment, a single pass (one cycle) across hot roller 78 is insufficient to remove the full 0.381 millimeters of uncured material. For this reason, the controller (not shown) is programmed to allow the drum to rotate a total of three revolutions such that substantially all of the molten polymer can be absorbed onto the web 76.

Although the most preferred embodiment requires three passes to remove all the molten polymer, it is to be understood that by selecting a different and more absorbent material with more favorable heat transfer characteristics, and by varying other parameters such as the thickness of the layer to be removed, it would be possible to achieve the desired absorption in fewer than three passes. Similarly, with other configurations, it would be necessary to pass the flexible sheet over the hot roller 78 more than three times.

After absorption, web 78 passes over a drive roller 106 which in the preferred embodiment is belt driven by a motor 108. In the preferred embodiment, motor 108 is a variable speed motor. The motor is of a size which will pull the web 76 through the device 10 at a linear speed which is synchronized with a linear speed of the outer surfaces of the preheating drum 18 and the hot roller 78.

The drive roller 106 in the first preferred embodiment has an abrasive outer surface. The roller 106 is preferably coated with an abrasive material such as sandpaper. The abrasive coating improves the frictional forces between the roller 106 and the web 76 and prevents slippage. The web 76 contacts at least one-third of the outer surface of the drive roller 106 in the preferred embodiment and loops over an idler roller 110 which aids in providing a substantially uniform tension to the web 76 throughout the device 10. In addition to the idler roller 110, a brake 112 is provided which prevents the supply roll from unrolling too rapidly, for example, before the drive roller 106 pulls the web through.

A second idler roller 114 is optionally provided to further maintain tension on the web 76. After the web 76 exits from between rollers 110 and 114, the web 76 is directed through another pair of guide rollers 116 and 118 and is collected on a take-up roller 120.

Take-up roller 120 in the preferred embodiment is belt driven by a variable speed motor 122. This motor speed must be adjusted so as to not interfere with the selected web tension. If the motor interferes with web tension, a flexographic plate formed in this manner could potentially have variable heights in the relief portions or might warp for example and be commercially unacceptable.

According to another preferred embodiment, a diameter sensor 124 is mounted onto the stationary frame 12 and measures the outer diameter of the absorbent material wound onto take-up roller 120. As the sensor 124 pivots, the output voltage from the sensor varies. In another preferred embodiment, a magnetic particle clutch (not shown) is mounted onto a rotating shaft supporting the take up roll 120, and the varying output voltage from sensor 124 varies the torque applied to the shaft to limit the rate of take-up. This clutch feature maintains substantially uniform tension on the portion of the web 76 near the take-up roll 120.

In another embodiment, the supply roll 96 is also equipped with a diameter sensor 126 which works in a substantially identical manner to sensor 124. The sensor 126 sends a signal to a magnetic particle brake (not shown) mounted onto a rotating shaft supporting the supply roll 96. The varying voltage varies the torque applied to the shaft supporting the supply roll 96, and maintains constant tension on the web 76. The magnetic particle brake is an example of an alternative device to replace the brake 112 to limit the unwinding of supply roll 96. The idler roller 110/drive roller 106 arrangement and magnetic particle brake delivers a web 76 having a uniform tension applied and that travels at a substantially constant rate of speed. In contrast, the brake 112 only roughly maintains tension in the web. The operation of brake 112 will be more completely described below.

In the most preferred embodiment, the guide roller 98, hot roller 78, drive roller 106, drive motor 108 and idler rollers 98 and 114 are all mounted onto a movable frame 102 actuated by a pneumatic cylinder 100.

Figure 9:
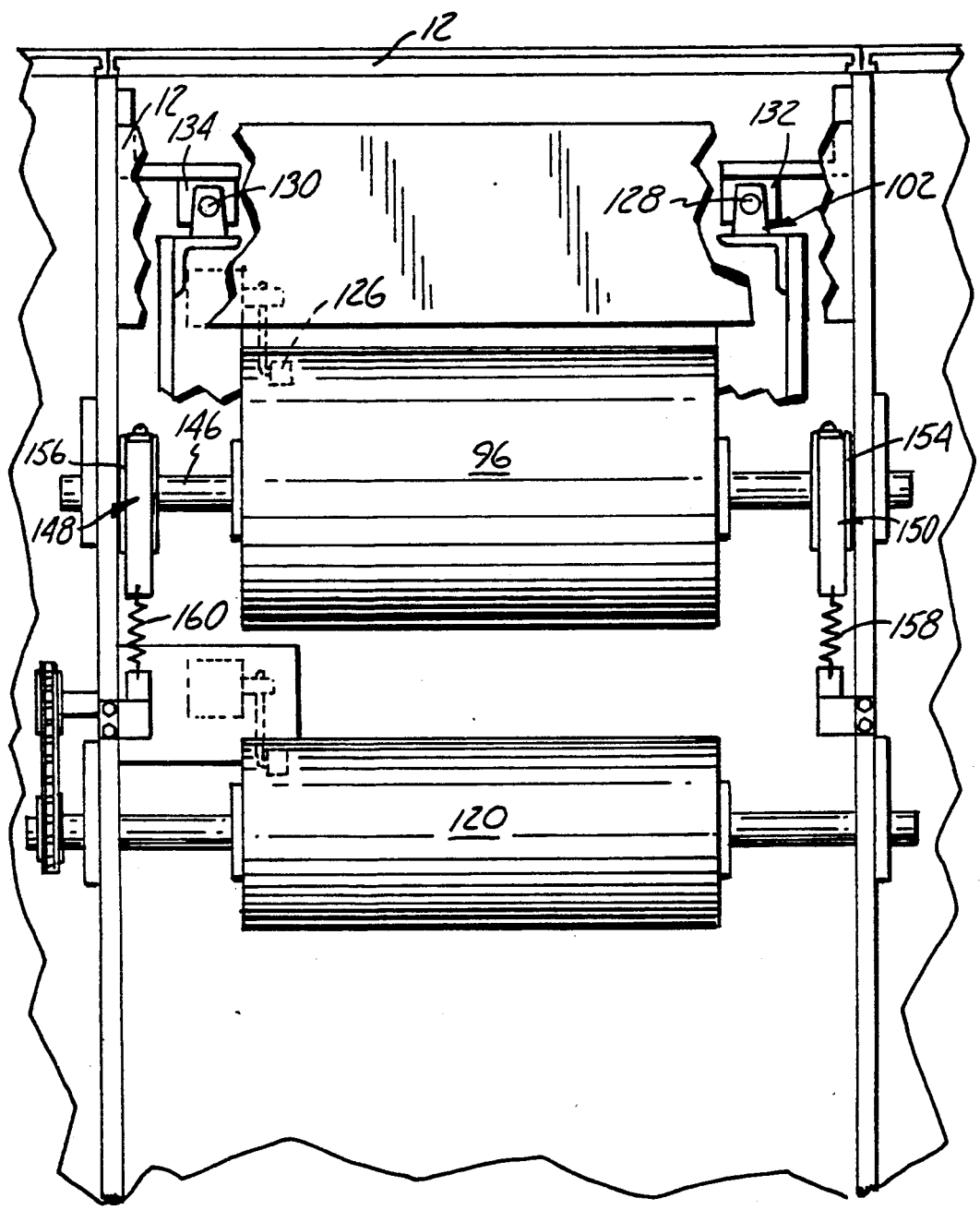
FIG. 9 is an end elevational view, partially cut out of the first embodiment of the present invention.

The movable support structure 102 shown in FIGS. 8 and 9 is suspended from two spaced apart rods 128 and 130 which slide horizontally through a pair of support brackets 132 and 134 toward the preheating drum 18. Support brackets 132 and 134 in the preferred embodiment are secured to the stationary frame 12.

In operation, when the pneumatic cylinder 100 as shown in FIG. 8 is actuated, the entire movable support structure 102 slides along spaced apart rods 128 and 130 until hot roller 78 contacts preheating drum 18. This position is referred to as the "running position."

The control means (not shown) in the preferred embodiment causes the assembly 102 to move into the running position as soon as a leading edge 24 (shown in FIG. 6) of the flexible sheet 16 reaches the nip 104. The hot roller 78 raises the temperature of the web 76 in the preferred embodiment to about 234 degrees Centigrade. At this temperature, the uncured portions of the upper layer of the flexible film 16 in contact with the heated web liquify. Due to the heat transfer characteristics of the most preferred composite flexible film 16, it is necessary to separate the web 76 from the flexible sheet 16 immediately after absorption. This is accomplished by pulling web 76 away from the surface of the flexible film 16, in a direction of about 90 degrees from the direction of travel of the film 16, shown as angle 135. It is believed that pulling the absorbent material away at an angle of at least 45 degrees is necessary to release the formed plate before the liquified polymer cools and resolidifies. The preferred range of angles is between 75 and 105 degrees, and the most preferred angle is about 90 degrees. After the point of absorption at the nip 104, the flexible film 16 sags slightly and separates briefly from the preheating drum 18. By pulling the web 76 at an angle slightly below the horizontal, the flexible film 16 and Web 76 rapidly separate. When the trailing edge of the flexible film 16 passes out of the nip 104, the controller (not shown) stops the drive motor 108, moves the hot roller 78 away from the drum 18 and rapidly advances the film 16 again so that the leading edge is returned to nip 104. This "rapid advance" feature causes the preheating drum 18 to rotate at 3 to 4 times the normal speed to save time, and improve machine capacity.

The brake 112 stops the travel of the web 76 while the preheating drum 18 is advancing to begin a new cycle. The brake 112 eliminates wasting unused web material 76. The device of the most preferred embodiment performs the absorption step three times on each sheet of flexible film 16.

At the conclusion of the third cycle, and as soon as a trailing edge of the flexible sheet 16 passes through the nip 104, the controller initiates a timing sequence utilizing the length measurement performed earlier to locate the trailing edge of the film 16. As soon as the film leaves the nip 104, the controller moves the hot roller 78 away from the film, and stops the drive motor 108. As the preheating drum 18 continues to rotate, cam operated microswitch 109 engages a cam on the drum 18 generating a signal received by the controller. The controller actuates a second pair of pneumatic cylinders 56 (shown in FIG. 3) which releases a leading edge of the flexible sheet 16.

The leading edge of the formed flexographic plate is also assisted in being released from the drum by a stripper 136 which includes a pneumatic cylinder 138 pivotally mounted at one end to a lower surface of the feed tray 14. At the opposite end of the cylinder 138 is pivotally mounted a stripper blade 140 which in the preferred embodiment extends transversely across the width of drum 18. The most preferred stripper blade 140 has a plurality of fingers which extend to an outer surface of the drum 18 and mesh with the teeth 26 of clamp 20 (shown in FIG. 2). The controller (not shown) at the conclusion of the third cycle, extends the stripper blade 140 until the blade contacts the outer surface of drum 18. A leading edge of a formed flexographic plate is gently lifted off the outer surface of the drum 18, and the plate moves in the direction shown by arrow 142. In the most preferred embodiment, a conveyor 144 removes each formed flexographic plate from the device 10. Idler roller 168 which in the preferred embodiment is part of the conveyor 144 is positioned between the hot roller 78 and the stripper 136. This roller 168 drives the film 16 after the clamp 20 releases the leading edge.

Referring back to FIG. 9, a supply roll 96 of absorbent material 76 is mounted onto a shaft 146 equipped with tensioning means which in the preferred embodiment are brakes 148 and 150. Brakes 148 and 150 are formed from flexible straps, each strap fixedly mounted at a first end 152 (shown in FIG. 8). The straps wrap around sheaves 154 and 156 which in the preferred embodiment have substantially smooth outer cylindrical surfaces. The sheaves 154 and 156 are fixedly mounted onto the supply roll shaft 146. The brakes 148, 150 according to the most preferred embodiment include flexible leather straps. The straps have first ends which are fixedly mounted 152 onto a stationary support 12 and have opposite ends equipped with tensioning springs 158 and 160 which are fixedly mounted onto the stationary frame 12.

In operation, brakes 148 and 150 provide tension on the web 76 as the web 76 is pulled through by the drive roller 106. The tension varies slightly as the diameter of supply roll 96 varies. In another preferred embodiment, a sensor 126 is provided for detecting the outside diameter of the supply roll 96. The sensor 126 is a potentiometer having a voltage which varies with pivotal position. The voltage output is sent to a magnetic particle brake (not shown) mounted onto shaft 146 which varies the torque output of the shaft 146. The magnetic particle brake and sensor 126 together maintain a substantially constant tension on the web 76.

Figure 11:
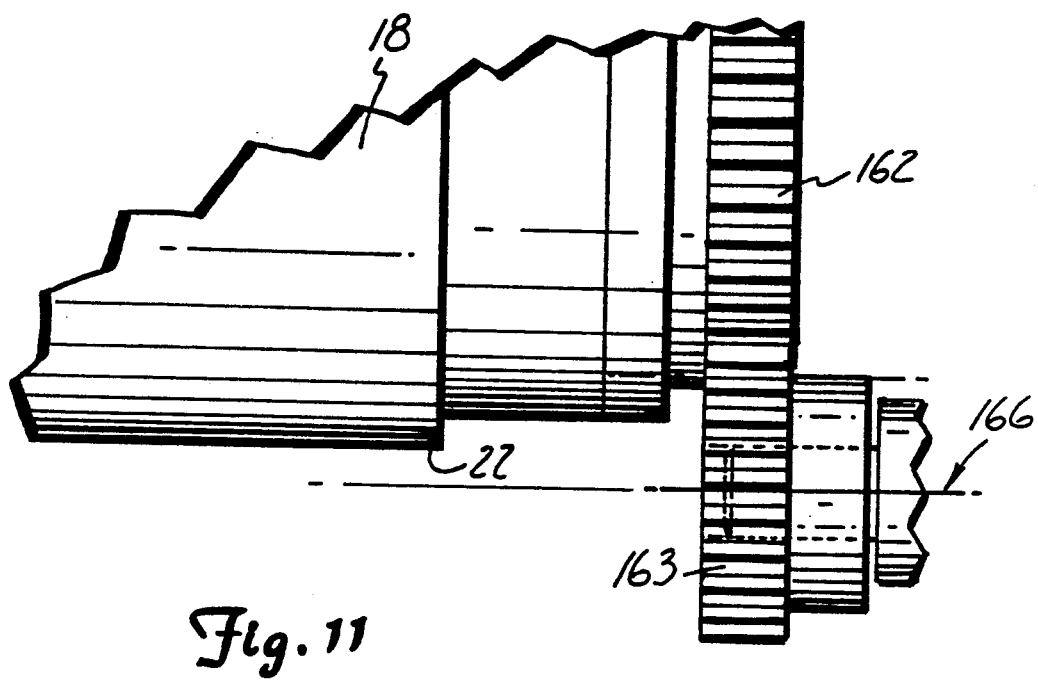
FIG. 11 is a more detailed view of the gear and pinion.

FIG. 10 is a side elevational view of the preheating drum 18 of a preferred embodiment of the present invention. A critical aspect of the present invention is to design the motion of the preheat roller 18 to achieve the smoothest possible rotation and to prevent backlash. A gear 162 is mounted onto a first end 164 of the preheating drum 18 and meshes with a pinion 163 at a point very near the outer surface 22 of the preheating drum 18. In the preferred embodiment, a brake consisting of an electrical circuit to reverse the direction of current supplied to the motor 73 is provided to stop the rotation of the preheating drum 18. This method of braking is commonly referred to as electro-dynamic braking. Referring to FIG. 11, a central axis 166 of the pinion 163 shaft is closely spaced to the outer surface 22 of the preheating drum 18, such that the gear 162 and pinion 163 mesh at a point proximate the outer surface 22.

The idler roller 92 shown in FIG. 10 in the preferred embodiment exerts minimal pressure, for example, only its own weight on the flexible sheet. Idler roller 92 forces entrained air out from beneath flexible film 16, and improves heat transfer from the drum 18 to the flexible film 16. An optional second idler roller 168 is spaced about 180 degrees from idler roller 92 and serves the purpose of driving the flexible film 16 after clamp 20 has released the leading edge. Idler roller 168 is also a part of a conveyor 144 (shown in FIG. 8) for moving the formed plates from the device 10. In the preferred embodiment, roller 168 is spring loaded against drum 18.

Although the control scheme of the most preferred embodiment employs the use of cam operated switches and timers to control the device 10, FIG. 10 shows an alternative device for controlling the operation of the present invention. In this embodiment, a encoder 170 is provided for generating a series of pulses to send to a number of counters. The counters are employed using known means to control the device 10.

Another aspect of the design of the preheating drum 16 of the preferred embodiment is illustrated in FIG. 12. The preheating drum 18 is constructed to avoid stresses which could warp the surface of the drum and produce an unacceptable flexographic printing plate. The preheating drum 18 has a main wall portion 172. Mounted onto each end of the substantially cylindrical main wall portion 172 are hubs 174 and 176 which are held in place by four spaced apart tie-rods 178 extending through both hubs 174 and 176. Proximate the center of each tie-rod 178 is a tensioning spring 180 that has the function of holding the hubs 174 and 176 against the main wall portion 172 and at the same time allows the main wall portion 172 to freely expand in a direction substantially parallel to the axis of rotation.

Figure 13:
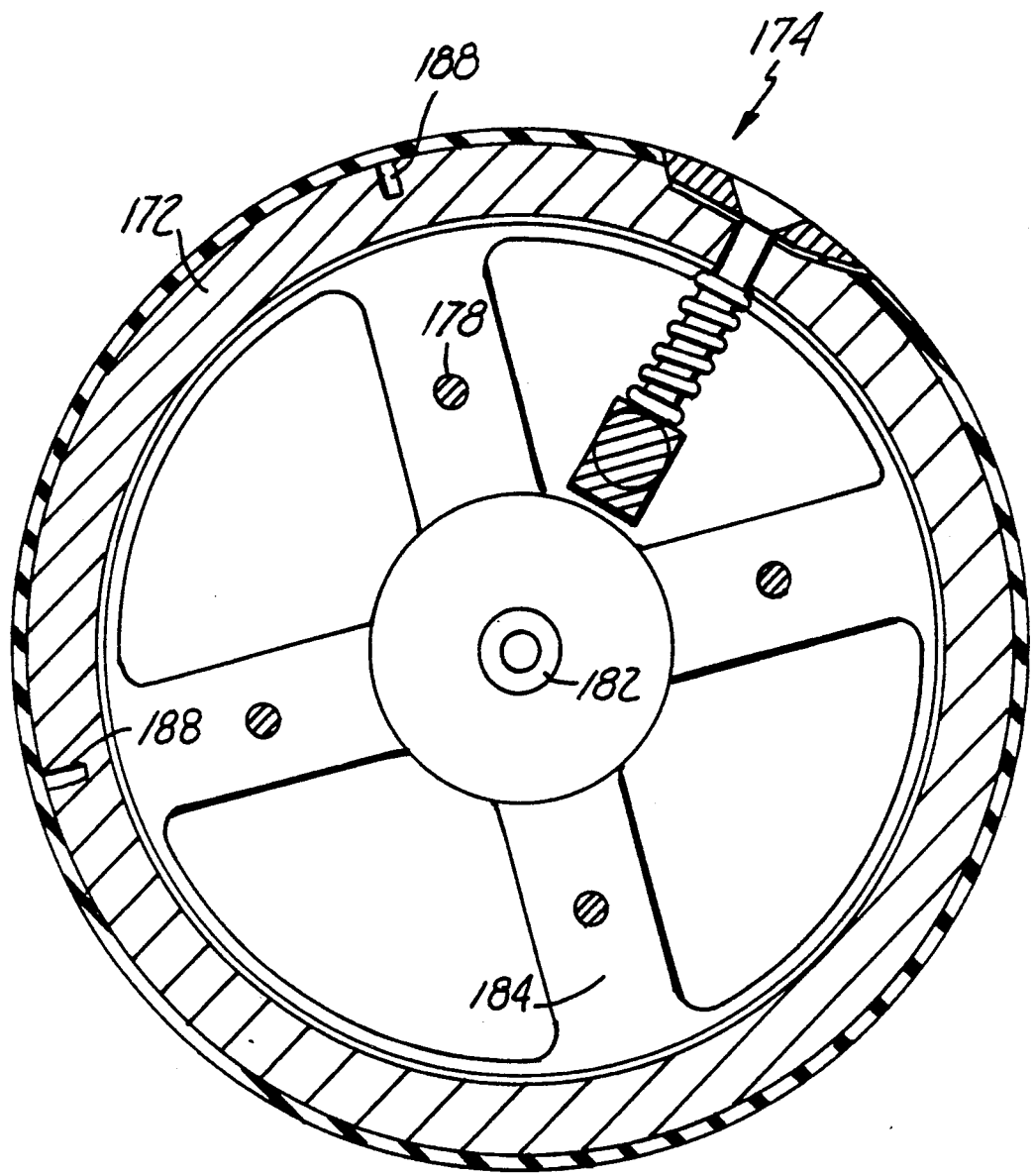
FIG. 13 is a side elevational view of the hub of the preheating drum.

The most preferred hub configuration is shown in FIG. 13. Each hub 174, 176 is mounted onto a central stub shaft 182. In the preferred embodiment, one stub shaft 182 is hollow. The tie rods 178 are mounted onto arms 184, each being spaced apart by about 90 degrees. The design of the preheating drum 18 not only provides for expansion in the direction parallel to the axis of shaft 182 but it also allows for expansion in all directions.

The most preferred embodiment of the present invention is equipped with a heating blanket 21 (shown in FIG. 4) mounted onto an inner surface of the main wall 172 of the preheating drum 18. The heating blanket 21 (shown in FIG. 4) provides sufficient heat to provide an outer skin temperature of approximately 174 degrees Centigrade. One of the shafts 182 is hollow to provide an opening for the conductive wires of the heating blanket 21 to come into contact with a rotating contact pad (not shown).

Hubs 174 and 176 are also equipped with four slots 188 which in the preferred embodiment are spaced apart at approximately 90 degrees from each other for accepting keys (not shown) from the main wall section 172 of the drum 18. The slots 188 and keys (not shown) together assure that the main wall section 172 remains concentric with respect to the axis of rotation of the drum 18 and prevent relative rotational movement between the hubs 174 and 176 and the main wall portion 172.

Referring back to FIG. 6, the outer surface of hot roller 78 is coated with a layer of elastomer coating 186. Although it is believed that a wide range of Shore A hardness units between about 30 and about 90 would be suitable to coat the hot roller 78, the most preferred rubber has a Shore A hardness of approximately 85 units. In the preferred embodiment, the rubber coating 186 is approximately 3/16 inch thick silicone rubber.

The heating roller 78 operates at a temperature of approximately 234 degrees Centigrade. Heat is provided to the heating roller 78 by a core heater available from Watlow Electric Company of St. Louis, Mo. A cartridge heater having a 0.952 centimeter diameter, a 55.88 centimeter length and having 1450 watts power requiring a 220 volt supply would provide sufficient energy to maintain a skin temperature of approximately 234 degrees Centigrade. Although the heating roller of the preferred embodiment includes an electrical core heater, the present invention contemplates the use of steam, oil, hot air, and a variety of other heating sources to provide a skin temperature sufficient to melt a portion of the flexible film.

Figure 14:
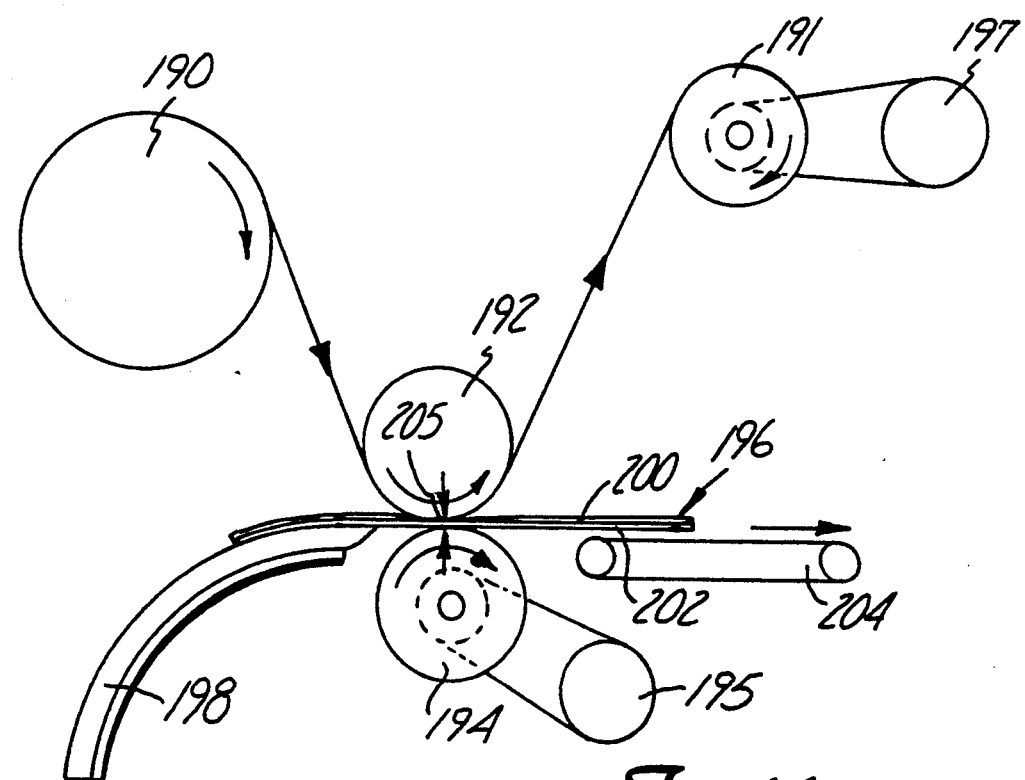
FIG. 14 is a schematic view of the second preferred embodiment of the present invention.

A second preferred embodiment of the present invention is shown schematically in FIG. 14. A flexible sheet 196 is placed on a platen 198 maintained at a temperature of approximately 174 degrees Centigrade. The platen 198 is hot enough to bring the uncured portions of the polymer layer 200 of the film 196 up to near the melt temperature, but does not melt the flexible substrate 202.

A supply roll 190 of absorbent material passes through a pair of pinch rollers 192 and 194 which are closely spaced to provide sufficient pressure to remove a portion of the liquified material. Pinch roll 192 is heated to a temperature slightly above the melt temperature of the polymer coating of the flexible film 196 (about 234 degrees Centigrade). The pinch roller 192 is heated with a core heater (not shown) identical to the core heater mentioned above. The absorbent web material 190 absorbs the liquified portions off of the film 196.

The used portions of the web are rolled onto a shaft to form a take up roll 191 which in this preferred embodiment is belt driven by a motor 197. The flexible sheet 196 is removed by a conveyor 204. The pinch roller 194 is also driven by a motor 195 in this embodiment.

As with the previous embodiment, the second preferred embodiment removes the continuous web 190 from the top surface 200 of sheet 196 at the point of absorption 205 (nip) and pulls the web in a direction which is at least 45 degrees from the direction of travel of the sheet. The speed of the web is synchronized to correspond to the linear speed of the sheet 196 to prevent waving, and other distortions in the formed flexographic printing plate.

FIG. 15 is a third preferred embodiment of the present invention. The device has a first pneumatic cylinder 206 which actuates a heated plate 208. The device also has a base 210 for accepting a flexible sheet of film 211. The base 210 is movable along a horizontally positioned rod 212. A continuous web of absorbent material 214 is urged under plate 208 by drive roller 209 driven by motor 213 and is positioned between the flexible sheet 211 and the heated plate 208. The sheet 211 is clamped onto the base 210 by a clamp 213. When the sheet 212 and web 214 are in place, cylinder 206 lowers the heated plate 208 into intimate contact with the absorbent material 214 which in turn is in contact with an upper surface of sheet 211. A movable clamp 215 engages the flexible sheet 211 to aid in separating the web 214 from the plate 211 after the pressing step. The heated plate 208 remains in place for a sufficient amount of time to liquify a portion of the polymer material and allow the liquified polymer material to be absorbed onto the absorbent web 214. Then the pneumatic cylinder 206 lifts the heated plate 208 as shown in FIG. 15. Attached to a base 210 is a rack 216 which cooperates with a pinion gear 218 to move the base 210 horizontally at a fixed rate of speed. At the same time, the web 214 and clamp 215 are advanced in the same direction at a substantially identical speed while idler rolls 220 and 222 separate the web from the formed flexographic sheet at an angle of about 90 degrees while maintaining the same linear velocity in the formed plate as in the web 214.

Optionally, a take up roller (not shown) may be provided as well as a belt driven motor (not shown) for collecting the used web 214.

Although the present invention has been described by the three above mentioned preferred embodiments, workers skilled in the art should recognize that changes may be made in form and detail without departing from the spirit and scope of the invention.

What is claimed is:

1. A device for forming a flexographic printing plate, the plate being formed from a sheet of film having at least one layer capable of being partially liquified, comprising:

heating means for applying heat to said sheet of film for an amount of time and at a temperature sufficient to cause a portion of said layer to liquify;

first delivery means for supplying an absorbent material to a surface of said layer of said sheet of film comprising a hot roller mounted for rotation in a first portion of a frame, wherein the hot roller has a resilient surface capable of causing the absorbent material to contact the liquified material in the recesses of the film, second delivery means for delivering the sheet of film to said heating means comprising a preheating drum mounted for rotation in a second portion of a frame, wherein at least one of the first and second frame portions are movable relative to the other, wherein the preheating drum is formed from a substantially cylindrical wall portion having a cavity defined by an inner surface of the cylindrical wall portion, a hub at each end, and means for attaching the hubs to the cylindrical wall portion to allow for thermal expansion;

pressure means for causing a surface of said layer and the absorbent material to come into face to face contact between the preheating drum and the hot roller at a pressure sufficient for at least a portion of the liquified material to be absorbed by the absorbent material; and separation means for separating the sheet of film from the absorbent material.

2. The device of claim 1 and further comprising a gear mounted onto an end of said preheating drum and a motor driven for engagement with said gear.

3. The device of claim 2 wherein the gear and pinion mesh along a central axis of the pinion in a plane substantially parallel to an axis of rotation of the drum, wherein the pinion axis is located substantially on an outer surface of the drum.

4. The device of claim 1 wherein the hot roller has a central substantially cylindrical cavity, and a core heater is positioned in the cavity.

5. The device of claim 1 wherein the hot roller has an outer surface coated with an elastomer.

6. The device of claim 1 and further comprising a heating blanket mounted onto the inner surface of said cylindrical wall portion.

7. The device of claim 1 and further comprising a drive roller for delivering a continuous sheet of absorbent material to the hot roller, the drive roll being mounted for rotation into the first portion of the frame.

8. The device of claim 7 wherein the drive roller comprises an abrasive substantially cylindrical outer surface.

9. The device of claim 7 and further comprising a variable speed motor for driving the drive roller.

10. The device of claim 1 and further comprising a braking means mounted onto the first portion of the frame.

11. The device of claim 10 wherein the braking means comprises a tensioning means for limiting a rotation of a rotatable shaft supporting a feed roll of absorbent material to the heating means.

12. The device of claim 11 wherein the tensioning means comprises a pair of spaced apart brakes, each brake mounted onto said rotatable shaft.

13. The device of claim 11 wherein the tensioning means comprises a magnetic particle clutch.

14. The device of claim 12 wherein each brake is formed from a spring biased flexible strap, the strap having a first end fixedly mounted onto the support frame, a second end connected to a spring, the spring being fixedly mounted onto the support frame, the strap extending around a sheave, the sheave being fixedly mounted onto a rotatable shaft for supporting a supply roll of an absorbent web material.

15. The device of claim 7 and further comprising at least one idler roller mounted for rotation onto the first portion of the frame in close contact with said drive roller for providing tension, wherein a web passes between said drive roller and said idler roller.

16. The device of claim 1 wherein the first portion of the frame is movable and the second portion of said frame is stationary wherein the second portion of said frame is moved to bring a surface of the hot roller into close contact with a surface of the preheating drum, wherein the preheating drum and hot roller rotate in opposite directions, and move at substantially the same tangential speed.

17. The device of claim 1 wherein the separation means comprises at least one idler roller means for drawing a web away from a surface of the flexible sheet of film after heating at an angle of at least about 45 degrees.

18. The device of claim 1 and further comprising a take up roller mounted for rotation onto the first portion of the frame for collecting a web of absorbent material after absorption.

19. The device of claim 1 and further comprising a supply roller shaft mounted for rotation onto the first portion of the frame for supporting a roll of absorbent material and a further comprising braking means for halting rotation of the supply roller shaft.

20. The device of claim 1 and further comprising a pneumatic means for moving a surface of the hot roller proximate a surface of the preheating drum.

21. The device of claim 1 and further comprising spring means mounted onto the frame for maintaining pressure between the hot roller and preheating drum.

22. The device of claim 20 wherein the first portion of the frame is movable and the second portion of the frame is stationary, wherein the hot roller is adapted to slide along a pair of bars attached to the stationary portion of said frame, wherein the pneumatic means comprises a pneumatic cylinder attached at one end to the stationary portion of said frame, and attached to the movable portion at an opposite end.

23. The device of claim 1 and further comprising a clamping device mounted onto the preheating drum and positioned transversely on an outer surface, wherein the clamping device grips a leading edge of the sheet of film.

24. The device of claim 23 wherein the clamping device is elongated and comprises a plurality of teeth which extend in a direction opposite the direction of travel of the sheet as the sheet contacts the drum.

25. The device of claim 24 wherein each tooth has an edge on a lower surface facing an upper surface of the sheet of film for gripping the sheet when the clamping device is lowered onto an edge of the sheet.

26. The device of claim 23 wherein the clamping device in the closed position is substantially flush mounted into an outer surface of said preheating drum.

27. The device of claim 23 wherein the clamping device is spring biased into a closed position.

28. The device of claim 23 and further comprising actuation means for opening and closing the clamping device.

29. The device of claim 28 and further comprising a pair of cam followers cooperating with said actuation means, each cam follower having an outer surface for applying pressure in a direction which is substantially radially outward from a rotational axis of said preheating drum.

30. The device of claim 1 wherein the preheating drum is coated with an elastomer.

31. The device of claim 30 wherein the elastomer is embedded with aluminum particles.

32. The device of claim 1 wherein the separation means comprises a stripper means for releasing the heated sheet from the preheating drum.

33. The device of claim 32 wherein the stripper means comprises an elongated stripper blade, wherein the stripper blade is positioned transverse on a surface of the preheating drum, and is pivotally mounted to a first end of a pneumatic cylinder, the pneumatic cylinder being mounted at an opposite end to the support frame.

34. The device of claim 33 and further comprising a transverse clamping device including a plurality of teeth mounted onto an outer wall of said preheating drum, wherein the stripper bade has a plurality of teeth portions which mesh with the toothed portions of the clamping device.

35. The device of claim 1 and further comprising conveyor means for delivering a formed flexographic plate after separation from the preheating drum.

36. The device of claim 1 wherein the separation means draws a web of absorbent material off of the flexible sheet at an angle of between about 75 degrees and about 105 degrees.

37. The device of claim 36 wherein the separation means further comprises actuation means for opening the clamping device at a selected rotational position of the preheating drum so that a formed plate is released from the preheating drum.

38. The device of claim 1 wherein the means for attaching the hubs comprises at least one key in the wall of the cylindrical wall portion, and at least one slot in the hub for accepting the key wherein the key is fitted into the slot.

39. The device of claim 1 wherein the means for attaching the hubs to the cylindrical wall portion comprises at least one tie rod extending through the cavity of the cylindrical wall portion, the tie rod being segmented and connected to both hubs.

40. The device of claim 39 wherein each tie rod is formed of two substantially rod shaped portions, the rod shaped portions being connected by a spring to allow for thermal expansion.

41. The device of claim 1 and further comprising a feed tray mounted onto the first portion of the frame proximate the preheating drum.

42. The device of claim 41 and further comprising a feed plate extending from the feed tray to a surface of the preheating drum.

43. The device of claim 42 wherein the feed plate is inclined to lift a leading edge of a sheet of film to a surface of the preheating drum.

44. The device of claim 1 and further comprising:
a drive roller mounted for rotation in the first portion of the frame;
an actuation device mounted to the first and second portions of the frame;
a clamp mounted transversely onto a surface of said preheating drum;
a stripper blade mounted onto the second portion of the frame for removing the film from the preheating drum;
control means for controlling the rotation of the drive roller which moves a continuous web of absorbent material over the hot roller, for controlling the rotation of the preheating drum, for actuating the actuation device for moving back and forth one of said frame portions, for opening and closing the clamp on the preheating drum, for controlling machine speed, for engaging the stripper blade, and for controlling hot roller and preheating drum temperatures according to a selected sequence.

45. A device for forming a flexographic printing plate, the plate being formed from a sheet of film comprising at least one heat resistant layer with a heat resistant surface, and one layer capable of being at least partially liquified having a heat sensitive surface, comprising:
a frame comprising a first portion and second portion, the first and second portions capable of movement relative to each other;
a preheating drum mounted for rotation onto a first portion of the frame for contacting the heat resistant surface of said sheet of film and for preheating the layer capable of being partially liquified through the heat resistant surface;
a hot roller mounted for rotation on a second portion of the frame for heating an absorbent material and for applying heat to the heat sensitive surface of the film, wherein said hot roller has a resilient outer surface which is capable of pressing the absorbent material into recesses formed in the film;
pressure means for causing the hot roller and the preheating drum to apply pressure on opposite sides of the film, causing the heat sensitive surface of said film and a surface of the heated absorbent material to come into face to face contact at a temperature and pressure sufficient for at least a portion of the heat sensitive layer to liquify and to be absorbed by the absorbent material; j
separation means for separating the sheet of film from the absorbent material; and
a pressure limiting arm mounted onto a rotational shaft of said hot roller for engagement with a surface of the preheating drum for limiting the spacing between an outer surface of the hot roller and an outer surface of the preheating drum.

46. A device for forming a flexographic printing plate, the plate being formed from a sheet of film comprising at least one heat resistant layer with a heat resistant surface, and one layer capable of being at least partially liquified having a heat sensitive surface, comprising:
a frame comprising a first portion and second portion, the first and second portions capable of movement relative to each other;
a preheating drum mounted for rotation onto a first portion of the frame for contacting the heat resistant surface of said sheet of film and for preheating the layer capable of being partially liquified through the heat resistant surface, wherein the preheating drum is formed from a substantially cylindrical wall portion having a cavity defined by an inner surface of the cylindrical wall portion, a hub at each end, and means for attaching the hubs to the cylindrical wall portion to allow for thermal expansion, wherein the means for attaching the hubs to the cylindrical wall portion comprises at least one tie rod extending through the cavity of the cylindrical wall portion, the tie rod being segmented and connected to both hubs,
a hot roller mounted for rotation on a second portion of the frame for heating an absorbent material and for applying heat to the heat sensitive surface of the film, wherein said hot roller has a resilient outer surface which is capable of pressing the absorbent material into recesses formed in the film;

pressure means for causing the hot roller and the preheating drum to apply pressure on opposite sides of the film, causing the heat sensitive surface of said film and a surface of the heated absorbent material to come into face to face contact at a temperature and pressure sufficient for at least a portion of the heat sensitive layer to liquify and to be absorbed by the absorbent material;

separation means for separating the sheet of film from the absorbent material.

47. The device of claim 46 wherein the tie rod of the means for attaching the hubs to the cylindrical wall portion of the preheating drum is formed of two substantially rod shaped portions, the rod shaped portions being connected by a spring to allow for thermal expansion.

48. A device for forming a flexographic printing plate, the plate being formed from a sheet of film having at least one layer capable of being partially liquified, comprising:

heating means for applying heat to said sheet of film for an amount of time and at a temperature sufficient to cause a portion of said layer to liquify;

first delivery means for supplying an absorbent material to a surface of said layer of said sheet of film comprising a hot roller mounted for rotation in a movable portion of a frame, wherein the hot roller has a resilient outer surface capable of causing the absorbent material to contact the liquified portion of the film within recesses in the film, second delivery means for delivering the sheet of film to said heating means comprising a preheating drum mounted for rotation in a stationary portion of a frame, wherein the movable portion of said frame is moved to bring a surface of the hot roller close enough to a surface of the preheating drum such that when the film and absorptive material are placed between the hot roller preheating drum, the hot roller and preheating drum press the film and absorptive material into contact, wherein the preheating drum and hot roller rotate in opposite directions, and move at substantially the same tangential speed; means for limiting the pressure exerted on the flexible sheet by the hot roller and the preheating drum;

pressure means for causing a surface of said layer and the absorbent material to come into face to face contact between the preheating drum and the hot roller at a pressure sufficient for at least a portion of the liquified material to be absorbed by the absorbent material; and separation means for separating the sheet of film from the absorbent material.

* * * * *

UNITED STATES PATENT AND TRADEMARK OFFICE
CERTIFICATE OF CORRECTION

PATENT NO. : 5,279,697
DATED : January 18, 1994
INVENTOR(S) : JOHN A. PETERSON, KURT F.F. FEIL, CRAIG D. LIEN, JOHN A. MARTENS, GARY A. STAUS, GARY D. VANDERWERFF It is certified that error appears in the above-identified patent and that said Letters Patent is hereby corrected as shown below:

On the Title Page:

delete [75] Inventors: John A. Peterson; Kurt F.F. Feil; Craig D. Lien; John A. Martens; Gary A. Staus; Gary D. VanDerWerff, all of St. Paul, Minn.

insert [75] Inventors: John A. Peterson, Hastings; Kurt F.F. Feil, Lake Elmo; Craig D. Lien, Minneapolis; John A. Martens, Dellwood; Gary A. Staus, White Bear Lake; Gary D. VanDerWerff, Lakeland, all of Minn.

Col. 19, line 36, delete "roll", insert --roller--
Col. 21, line 13, delete "bade", insert --blade--

Signed and Sealed this

Twenty-eighth Day of June, 1994

Attest:

BRUCE LEHMAN

Attesting Officer        Commissioner of Patents and Trademarks